US011436981B2

(12) United States Patent
Bai et al.

(10) Patent No.: US 11,436,981 B2
(45) Date of Patent: Sep. 6, 2022

(54) DISPLAY SUBSTRATE, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lu Bai, Beijing (CN); Xin Zhang, Beijing (CN); Pengfei Yu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/282,373

(22) PCT Filed: Jun. 4, 2020

(86) PCT No.: PCT/CN2020/094316
§ 371 (c)(1),
(2) Date: Apr. 1, 2021

(87) PCT Pub. No.: WO2021/243638
PCT Pub. Date: Dec. 9, 2021

(65) Prior Publication Data
US 2022/0189405 A1    Jun. 16, 2022

(51) Int. Cl.
*G09G 3/36* (2006.01)
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0852* (2013.01); *G09G 2310/0286* (2013.01); *G09G 2310/061* (2013.01)

(58) Field of Classification Search
CPC ......... G09G 3/3266; G09G 2300/0852; G09G 2310/0286; G09G 2310/061;
(Continued)

(56) References Cited

U.S. PATENT DOCUMENTS 8,743,044 B2 *  6/2014  Umezaki ................ G11C 19/28
                                                    345/100
10,847,093 B2 * 11/2020 In ........................ G09G 3/3275
(Continued)

*Primary Examiner* — Duc Q Dinh
(74) *Attorney, Agent, or Firm* — McCoy Russell LLP

(57) ABSTRACT

A display substrate, a manufacturing method and a display device are provided. The display substrate includes a scan driving circuit; the scan driving circuit includes a plurality of shift register units, at least one shift register unit includes a signal output line and an output circuit, the output circuit includes an output transistor and an output reset transistor; the signal output line includes a first output line portion extending along the first direction; the first output line portion is coupled to the second electrode of the output transistor or the output reset transistor through a plurality of first or second signal line via holes arranged in a signal line overlap area, and the plurality of first or second signal line via holes are arranged along the first direction.

27 Claims, 13 Drawing Sheets

(58) Field of Classification Search
CPC ......... G09G 3/2039; G09G 2300/0426; G09G 3/3275; G09G 2310/0267; G09G 2310/026; H01L 27/32; H01L 27/124; H01L 27/3276; H01L 2251/5338; G02F 1/136286; G02F 1/136227; G11C 7/1051
See application file for complete search history.

(56) References Cited

U.S. PATENT DOCUMENTS

2018/0069031 A1\* 3/2018 Wu .................... H01L 29/78696
2019/0295472 A1\* 9/2019 Yang .................... G09G 3/3291

\* cited by examiner

DISPLAY SUBSTRATE, MANUFACTURING METHOD THEREOF, AND DISPLAY DEVICE

CROSS REFERENCE TO RELATED APPLICATIONS

The present application is a U.S. National Phase of International Application No. PCT/CN2020/094316 entitled "DISPLAY SUBSTRATE, MANUFACTURING METHOD THEREOF, AND DISPLAY DEVICE," and filed on Jun. 4, 2020. The entire contents of the above-listed application is hereby incorporated by reference for all purposes.

TECHNICAL FIELD

The present disclosure relates to the field of display technology, in particular to a display substrate, a manufacturing method thereof, and a display device.

BACKGROUND AND SUMMARY

Active-Matrix Organic Light-Emitting Diode (AMO-LED) display panels are widely used in various fields due to the advantages of low power consumption, low production cost, and wide color gamut.

The AMOLED display panel includes a pixel circuit located in a display area and a scan driving circuit located in an edge area. The pixel circuit includes a plurality of sub-pixel circuits distributed in an array. The scan driving circuit includes a plurality of shift register units. Each shift register unit is used to provide a light emitting control signal for the corresponding sub-pixel circuit. Since the scan driving circuit is arranged in the edge area of the AMOLED display panel, the arrangement of the scan driving circuit determines the frame width of the AMOLED display panel.

In one aspect, the present disclosure provides in some embodiments a display substrate including a scan driving circuit and a display area provided on a base substrate, wherein the scan driving circuit includes a plurality of shift register units, and at least one of the plurality of shift register units includes a signal output line and an output circuit, and the output circuit includes an output transistor and an output reset transistor; the signal output line includes a first output line portion extending in a first direction; the first output line portion is coupled to a second electrode of the output transistor through a plurality of first signal line via holes arranged in a signal line overlap area, and the first output line portion is coupled to a second electrode of the output reset transistor through a plurality of second signal line via holes arranged in the signal line overlap area; the plurality of first signal line via holes is arranged in sequence along the first direction, and the plurality of second signal line via holes is arranged in sequence along the first direction; the signal line overlap area includes a first signal line overlap area and a second signal line overlap area, and the first signal line overlap area is an overlap area between an orthographic projection of the first output line portion on the base substrate and an orthographic projection of a first source-drain metal pattern on the base substrate, the second electrode of the output transistor is included in the first source-drain metal pattern, the second signal line overlap area is an overlap area between the orthographic projection of the first output line portion on the base substrate and the orthographic projection of a second source-drain metal pattern on the base substrate, the second electrode of the output reset transistor is included in the second source-drain metal pattern; a ratio of a maximum distance in the first direction between any two first signal line via holes arranged in sequence along the first direction to a third length is a first predetermined ratio; a minimum distance in the first direction between two adjacent first signal line via holes is a first predetermined distance; the third length is a length of the first single line overlap area in the first direction; a ratio of a maximum distance in the first direction between any two second signal line via holes arranged in sequence along the first direction to a fourth length is a second predetermined ratio; a minimum distance in the first direction between two adjacent second signal line via holes is a second predetermined distance; the fourth length is a length of the second signal line overlap area in the first direction; the first predetermined ratio is greater than or equal to 0.05 and less than or equal to 0.9; the first predetermined distance is greater than or equal to 1.5 um and less than or equal to 45 um; the second predetermined ratio is greater than or equal to 0.05 and less than or equal to 0.9; the second predetermined distance is greater than or equal to 1.5 um and less than or equal to 65 um.

Optionally, an active layer of the output transistor and an active layer of the output reset transistor are arranged along the first direction, and a length of the active layer of the output transistor in the first direction is a first length, a length of the active layer of the output reset transistor in the first direction is a second length, and a sum of the first length and the second length is an output active length; a smaller one of a minimum width of the active layer of the output transistor in the second direction and a minimum width of the active layer of the output reset transistor in the second direction is an output active width; the first direction intersects the second direction.

Optionally, a ratio of the output active length to the output active width is within a predetermined ratio range; the predetermined ratio range is greater than or equal to 3 and less than or equal to 11.

Optionally, the output active width is within a predetermined width range; the predetermined width range is greater than or equal to 12 um and less than or equal to 45 um.

Optionally, an active layer of the output transistor and an active layer of the output reset transistor are formed by a continuous first semiconductor layer extending in the first direction; a length of the first semiconductor layer in the first direction is an output active length; a minimum length of the first semiconductor layer in the second direction is the output active length.

Optionally, the at least one shift register unit further includes a first transistor; the first transistor includes a first active pattern, and the first active pattern extends in the second direction; the first transistor is located on a side of the output circuit away from the display area.

Optionally, the at least one shift register unit further includes a second transistor and a third transistor, a second electrode of the second transistor is coupled to a second electrode of the third transistor; a maximum distance in the second direction between an orthographic projection of a gate electrode of the second transistor on the base substrate and an orthographic projection of a gate electrode of the third transistor on the base substrate is a third predetermined distance; the second transistor and the third transistor are located on a side of the output circuit away from the display area.

Optionally, the third predetermined distance is greater than or equal to 14 um and less than or equal to 50 um.

Optionally, the at least one shift register unit further includes a first transistor, a second transistor, and a first capacitor, a second electrode of the first transistor and a first electrode of the second transistor are respectively coupled to a second electrode plate of the first capacitor, and a gate electrode of the first transistor is coupled to a first electrode plate of the first capacitor; the first transistor, the first capacitor, and the second transistor are arranged in sequence along the first direction; the first transistor, the first capacitor and the second transistor are located on a side of the output circuit away from the display area.

Optionally, the scan driving circuit further includes a first voltage signal line, and the at least one shift register unit further includes an output reset capacitor, a first electrode plate of the output reset capacitor is coupled to a gate electrode of the output reset transistor, and a second electrode plate of the output reset capacitor is coupled to the first voltage signal line; a maximum width of the second electrode plate of the output reset capacitor in the second direction is a first predetermined width, and a maximum length of the second electrode plate of the output reset capacitor in the first direction is a second predetermined length; the output reset capacitor is located on a side of the output circuit away from the display area; an orthographic projection of the second electrode plate of the output reset capacitor on the base substrate is within an orthographic projection of the first electrode plate of the output reset capacitor on the base substrate.

Optionally, the first predetermined width is greater than or equal to 3 um and less than or equal to 60 um, and the second predetermined length is greater than or equal to 3 um and less than or equal to 20 um.

Optionally, the first voltage signal line extends along the first direction, and the first voltage signal line is located on a side of the output reset capacitor away from the display area.

Optionally, the output transistor and the output reset transistor are arranged along the first direction; the scan driving circuit further includes a second voltage signal line; the at least one shift register unit further includes an output reset capacitor; a second electrode plate of the output reset capacitor is coupled to the first voltage signal line; a first electrode of the output transistor is coupled to the second voltage signal line, and a first electrode of the output reset transistor is coupled to a second electrode plate of the output reset capacitor; the output transistor and the output reset transistor are located on a side of the second voltage signal line away from the display area.

Optionally, a gate electrode of the output transistor includes at least one output gate pattern, the first electrode of the output transistor includes at least one first electrode pattern, and the second electrode of the output transistor includes at least one second electrode pattern; the output gate pattern is located between first electrode pattern and the second electrode pattern adjacent to each other; the first electrode pattern, the output gate pattern, and the second electrode pattern all extend along the second direction.

Optionally, a gate electrode of the output reset transistor includes at least one output reset gate pattern, a first electrode of the output reset transistor includes at least one third electrode pattern, and the second electrode of the output reset transistor includes at least one fourth electrode pattern; the output reset gate pattern is located between the third electrode pattern and the fourth electrode pattern adjacent to each other; the third electrode pattern, the output reset gate pattern and the fourth electrode pattern all extend along the second direction; the fourth electrode pattern of the output reset transistor closest to a gate electrode of the output transistor is multiplexed as the second electrode pattern of the output transistor.

Optionally, an active layer of the output transistor includes at least two first conductive portions arranged oppositely along the first direction, and at least one first channel portion; each first channel portion is arranged between two adjacent first conductive portions; the first channel portions correspond to the output gate patterns in a one-to-one manner, and an orthographic projection of each first channel portion on the base substrate is located within an orthographic projection of the corresponding output gate pattern on the base substrate; a part of the first conductive portions of the output transistor correspond to the first electrode patterns in a one-to-one manner, and there is a first overlap area between an orthographic projection of the first electrode pattern on the base substrate and an orthographic projection of the first conductive portion on the base substrate, and the first electrode pattern is coupled to the corresponding first conductive portion through at least one first via hole provided in the first overlap area; another part of the first conductive portions of the output transistor correspond to the second electrode patterns in a one-to-one manner, and there is a second overlap area between an orthographic projection of the second electrode pattern on the base substrate and the orthographic projection of the first conductive portion on the base substrate, and the second electrode pattern is coupled to the corresponding first conductive portion through at least one second via hole provided in the second overlap area.

Optionally, an active layer of the output reset transistor includes at least two second conductive portions arranged oppositely along the first direction, and at least one second channel portion; each second channel portion is arranged between two adjacent second conductive portions; the second channel portions correspond to the output reset gate patterns in a one-to-one manner, and an orthographic projection of each second channel portion on the base substrate is within an orthographic projection of the corresponding output reset gate pattern on the base substrate; a part of the second conductive portions of the output reset transistor correspond to the third electrode patterns in a one-to-one manner, and there is a third overlap area between an orthographic projection of the third electrode pattern on the base substrate and an orthographic projection of a corresponding second conductive portion on the base substrate, and the third electrode pattern is coupled to the corresponding second conductive portion through at least one third via hole provided in the third overlap area; another part of the second conductive portions of the output reset transistor correspond to the fourth electrode patterns in a one-to-one manner, and there is a fourth overlap area between an orthographic projection of the fourth electrode pattern on the base substrate and an orthographic projection of a corresponding second conductive portion on the base substrate, and the fourth electrode pattern is coupled to the corresponding second conductive portion through at least one fourth via hole provided in the fourth overlap area.

Optionally, the scan driving circuit further includes a second voltage signal line; the at least one shift register unit further includes a fourth transistor; the second voltage signal line is coupled to an electrode conductive connection portion, the electrode conductive connection portion extends along the second direction; the at least one first electrode pattern is arranged in sequence along the first direction; the electrode conductive connection portion is coupled to a first first electrode pattern included in the first electrode of the output transistor; a first electrode of the fourth transistor is coupled to the electrode conductive connection portion; a minimum distance in the first direction between an orthographic projection of a gate electrode of the fourth transistor on the base substrate and an orthographic projection of the electrode conductive connection portion on the base substrate is a fourth predetermined distance.

Optionally, the fourth predetermined distance is greater than or equal to 1 um and less than or equal to 5 um.

Optionally, the at least one shift register unit further includes a fourth transistor and a fifth transistor; a gate electrode of the fourth transistor is coupled to a gate electrode of the fifth transistor; the gate electrode of the fourth transistor and the gate electrode of the fifth transistor are included in a first gate metal pattern, and the first gate metal pattern extends in the second direction.

Optionally, the scan driving circuit further includes a first clock signal line, and the gate electrode of the fifth transistor is coupled to the first clock signal line; the first clock signal line extends along a first direction, and the first clock signal line is located on a side of the five transistor away from the display area.

Optionally, the at least one shift register unit further includes a first transistor, a fourth transistor, a fifth transistor, a sixth transistor, and an output capacitor; a first electrode of the fifth transistor is coupled to an input signal end, a second electrode of the fifth transistor is coupled to a gate electrode of the sixth transistor; a gate electrode of the sixth transistor includes a first gate pattern and a second gate pattern coupled to each other; the first gate pattern and the second gate pattern are respectively coupled to a first electrode plate of the output capacitor, and the first electrode plate of the output capacitor is coupled to a gate electrode of the output transistor; a first electrode of the sixth transistor is coupled to a gate electrode of the fourth transistor, a second electrode of the sixth transistor is coupled to a second electrode of the fourth transistor, and a second electrode plate of the output capacitor is coupled to a first electrode of the first transistor; the fourth transistor, the sixth transistor, and the first transistor are sequentially arranged along the first direction; the fifth transistor, the sixth transistor, and the first transistor are sequentially arranged along the first direction; the output capacitor is located between the sixth transistor and the output circuit.

Optionally, the at least one shift register unit further includes a second transistor, a first transistor, a sixth transistor, a seventh transistor and the eighth transistor; an active layer of the seventh transistor and an active layer of the eighth transistor are formed by a continuous second semiconductor layer, and the second semiconductor layer extends along the first direction; the active layer of the seventh transistor includes a first ninth conductive portion, a ninth channel portion, and a second ninth conductive portion sequentially arranged along the first direction; the second ninth conductive portion is multiplexed as a first tenth conductive portion; the active layer of the eighth transistor includes the first tenth conductive portion, a tenth channel portion, and a second tenth conductive portion sequentially arranged along the first direction; the first ninth conductive portion is used as a second electrode of the seventh transistor, the second ninth conductive portion is used as a first electrode of the seventh transistor, and the second tenth conductive portion is used as a first electrode of the eighth transistor, and a first electrode of the seventh transistor is multiplexed as a second electrode of the eighth transistor; a gate electrode of the seventh transistor is coupled to second electrode plate of the output capacitor, and a second electrode of the seventh transistor is coupled to a gate electrode of the sixth transistor; a gate electrode of the eighth transistor is coupled to a gate electrode of the first transistor, and a first electrode of the eighth transistor is coupled to the first voltage signal line; the first voltage signal line extends along a first direction; the sixth transistor, the seventh transistor, the eighth transistor, and the second transistor are sequentially arranged along the first direction.

Optionally, the scan driving circuit further includes a second clock signal line, a gate electrode of the second transistor and a gate electrode of the seventh transistor are respectively coupled to the second clock signal line; the second clock signal line extends along the first direction, and the second clock signal line is located on a side of the second transistor away from the display area.

Optionally, the scan driving circuit further includes a second voltage signal line and a signal output line; the signal output line includes a first output line portion and at least one second output line portion; both the second voltage signal line and the first output line portion extend in a first direction, and the first output line portion is located between the second voltage signal line and the output circuit; the second output line portion extends along the second direction; the second output line portion is used to provide a light emitting control signal for a pixel circuit in the display area; the first output line portion and the output circuit are located on a side of the second voltage signal line away from the display area.

Optionally, the scan driving circuit further includes a first voltage signal line, a second voltage signal line, a first clock signal line, and a second clock signal line; the first voltage signal line, the second voltage signal line, the first clock signal line, and the second clock signal line all extend in a first direction; an orthographic projection of the first voltage signal line on the base substrate, an orthographic projection of the first clock signal line on the base substrate, and an orthographic projection of the second clock signal line on the base substrate are all located a side of an orthographic projection of the shift register unit on the base substrate away from the display area; the orthographic projection of the second voltage signal line on the substrate is located on a side of the shift register unit close to the display area.

Optionally, the signal output line further includes at least one second output line portion, and the second output line portion is coupled to the first output line portion; the second output line portion extends to the display area and is used to provide a light emitting control signal for a pixel circuit in the display area.

Optionally, the scan driving circuit includes a first voltage signal line, a second voltage signal line, a first clock signal line, a second clock signal line, and a signal output line; the at least one shift register unit includes a first capacitor, an output capacitor, an output reset capacitor, a first transistor, a second transistor, a third transistor, a fourth transistor, a fifth transistor, a sixth transistor, a seventh transistor, and an eighth transistor, the signal output line includes at least one second output line portion; a gate electrode of the output transistor is coupled to a first electrode plate of the output capacitor, a first electrode of the output transistor is coupled to the second voltage signal line, and a second electrode of the output transistor is coupled to the signal output line; a gate electrode of the output reset transistor is coupled to a first electrode plate of the output reset capacitor, a first electrode of the output reset transistor is coupled to a second electrode plate of the output reset capacitor, a second electrode of the output reset transistor is coupled to the signal output line; a second electrode plate of the output reset capacitor is coupled to the first voltage signal line; a second electrode plate of the output capacitor is coupled to a gate electrode of the seventh transistor; a first electrode of the first transistor is coupled to the second electrode plate of the output capacitor, and a second electrode of the first transistor and a first electrode of the second transistor are respectively coupled to the second electrode plate of the first capacitor, and a gate electrode of the first transistor is coupled to the first electrode plate of the first capacitor; a gate electrode of the second transistor and a gate electrode of the seventh transistor are respectively coupled to the second clock signal line, and a second electrode of the second transistor is coupled to a second electrode of the third transistor; a gate electrode of the third transistor is coupled to a gate electrode of the output transistor, and a first electrode of the third transistor is coupled to the first electrode plate of the output reset capacitor; a gate electrode of the fourth transistor is coupled to a gate electrode of the fifth transistor, a first electrode of the fourth transistor is coupled to the first electrode of the output transistor, and a second electrode of the fourth transistor is coupled to a second electrode of the sixth transistor; a gate electrode of the fifth transistor is coupled to the first clock signal line, a second electrode of the fifth transistor is coupled to a gate electrode of the sixth transistor; a first electrode of the fifth transistor is coupled to the input signal end; a first electrode of the sixth transistor is coupled to the gate electrode of the fourth transistor, and the second electrode of the sixth transistor is coupled to the second electrode of the fourth transistor; a gate electrode of the seventh transistor is coupled to the second electrode plate of the output capacitor, a first electrode of the seventh transistor is multiplexed as a second electrode of the eighth transistor, a second electrode of the seventh transistor is coupled to the gate electrode of the sixth transistor; a gate electrode of the eighth transistor is coupled to the gate electrode of the first transistor, and a first electrode of the eighth transistor is coupled to the first voltage signal line; the second output line portion is coupled to the first output line portion; the second output line portion extends to the display area, and is used to provide a light emitting control signal for a pixel circuit in the display area.

Optionally, the second voltage signal line is arranged on a side of the shift register unit close to the display area; the first voltage signal line, the first clock signal line and the second clock signal line are arranged on a side of the shift register unit away from the display area; along the direction close to the display area, the first clock signal line, the second clock signal line, and the first voltage signal line are arranged in sequence; or, along the direction close to the display area, the second clock signal line, the first clock signal line, and the first voltage signal line are arranged in sequence.

Optionally, the scan driving circuit further includes a first start signal line and a second start signal line; along the direction close to the display area, the second start signal line, the first start signal line, the first clock signal line, the second clock signal line, and the first voltage signal line are arranged in sequence; or along the direction close to the display area, the first start signal line, the second start signal line, the first clock signal line, the second clock signal line, and the first voltage signal line are arranged in sequence; or along the direction close to the display area, the second start signal line, the first start signal line, the second clock signal line, the first clock signal line, and the first voltage signal line are arranged in sequence; or along the direction close to the display area, the first start signal line, the second start signal line, the second clock signal line, the first clock signal line, and the first voltage signal line are arranged in sequence.

Optionally, the output transistor and the output reset transistor are located between the output capacitor and the first output line portion; along the first direction, the output transistor and the output reset transistor are arranged in sequence; the first capacitor, the output capacitor, the output reset capacitor, the first transistor, the second transistor, the third transistor, the fourth transistor, the fifth transistor, the sixth transistor, the seventh transistor, and the eight transistor; along the first direction, the fifth transistor, the sixth transistor, the seventh transistor, the eighth transistor, the first transistor, the first capacitor, the second transistor and the output reset transistor are arranged in sequence; the fifth transistor, the fourth transistor, the sixth transistor, the seventh transistor, and the eighth transistor are located between the output capacitor and the first voltage signal line; the gate electrode of the fifth transistor and the gate electrode of the fourth transistor are included in a first gate metal pattern, and the first gate metal pattern extends along the second direction.

Optionally, the display substrate further includes a plurality of rows of pixel circuits arranged on the base substrate; the pixel circuit includes a light emitting control end; the shift register unit corresponds to at least one row of the pixel circuits; the signal output line of the shift register unit is coupled to the light emitting control end of the at least one row of pixel circuits, and is used to provide a light emitting control signal for the light emitting control end of the at least one row of pixel circuits.

In a second aspect, an embodiment of the present disclosure provides a method of manufacturing a display substrate, comprising manufacturing a scan driving circuit on a base substrate; wherein the scan driving circuit includes a plurality of shift register units, and at least one of the plurality of shift register units includes an output circuit; the output circuit includes an output transistor and an output reset transistor; the method further includes: forming a semiconductor layer on the base substrate, and performing a patterning process on the semiconductor layer to form an active layer of an output transistor and an active layer of an output reset transistor; forming a first gate metal layer on a side of the semiconductor layer away from the substrate, and performing a patterning process on the first gate metal layer to form a gate electrode of the output transistor and a gate electrode of the output reset transistor; using the gate electrode of the output transistor and the gate electrode of the output reset transistor as a mask, doping a portion of the semiconductor layer that is not covered by the gate electrodes so that the portion of the semiconductor layer that is not covered by the gate electrodes is formed as a conductive portion, and a part of the semiconductor layer that is covered by the gate electrodes is formed as a channel portion; forming a second gate metal layer on a side of the first gate metal layer away from the semiconductor layer, and performing a patterning process on the second gate metal layer to form a signal output line; the signal output line including a first output line portion extending in the direction; forming a first insulating layer on a side of the second gate metal layer away from the first gate metal layer; forming a plurality of first signal line via holes and a plurality of second signal line via holes in an area where the first insulating layer and the first output line partially overlap; the first signal line via holes and the second signal line via holes penetrating the first insulating layer; forming a source-drain metal layer on a side of the first insulating layer away from the second gate metal layer, and performing a patterning process on the source-drain metal layer to form a first source-drain metal pattern and a second source-drain metal pattern, the first source-drain metal pattern including the second electrode of the output transistor, and the second source-drain metal pattern including the second electrode of the output reset transistor, so that the first output line portion is coupled to the second electrode of the output transistor through the plurality of first signal line via holes, and the first output line portion is coupled to the second electrode of the output reset transistor through the plurality of second signal line via holes; the signal output line includes a first output line portion extending in a first direction; the plurality of first signal line via holes are arranged in sequence along the first direction, and the plurality of second signal line via holes are arranged in sequence along the first direction; a ratio of a maximum distance in the first direction between any two first signal line via holes arranged in sequence along the first direction to a third length is a first predetermined ratio; a minimum distance between two adjacent first signal line via holes in the first direction is a first predetermined distance; a ratio of a maximum distance in the first direction between any two second signal line via holes arranged in sequence along the first direction to a fourth length is a second predetermined ratio; a minimum distance between two adjacent second signal line via holes in the first direction is a second predetermined distance; the third length is a length of the first signal line overlap area in the first direction, and the fourth length is a length of the second signal line overlap area in the first direction; the first predetermined ratio is greater than or equal to 0.05 and less than or equal to 0.9; the first predetermined distance is greater than or equal to 1.5 um and less than or equal to 45 um; the second predetermined ratio is greater than or equal to 0.05 and less than or equal to 0.9; the second predetermined distance is greater than or equal to 1.5 um and less than or equal to 65 um.

Optionally, a length of an active layer of the output transistor in the first direction is a first length, and a length of an active layer of the output reset transistor in the first direction is a second length, a sum of the first length and the second length is a output active length; a smaller one of a minimum width of the active layer of the output transistor in the second direction and a minimum width of the active layer of the output reset transistor in the second direction is an output active width; the first direction intersects the second direction.

Optionally, a ratio of the output active length to the output active width is within a predetermined ratio range; the predetermined ratio range is greater than or equal to 3 and less than or equal to 11.

Optionally, the output active width is within a predetermined width range; the predetermined width range is greater than or equal to 12 um and less than or equal to 45 um.

In a third aspect, an embodiment of the present disclosure provides a display device comprising the display substrate.

DETAILED DESCRIPTION

The technical solutions in the embodiments of the present disclosure will be clearly and completely described below in conjunction with the accompanying drawings in the embodiments of the present disclosure. Obviously, the described embodiments are only a part of the embodiments of the present disclosure, not all of the embodiments. Based on the embodiments in the present disclosure, all other embodiments obtained by those of ordinary skill in the art without creative work fall within the protection scope of the present disclosure.

Figure 1:
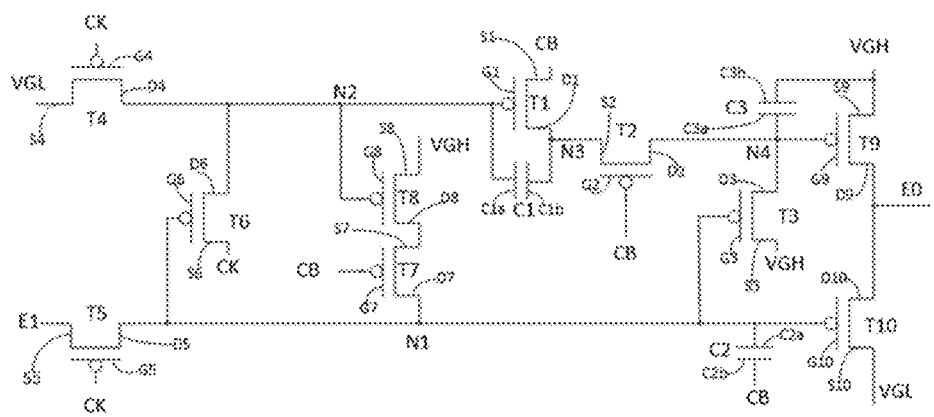
FIG. 1 is a circuit diagram of at least one shift register unit included in a display substrate according to at least one embodiment of the present disclosure.

As shown in FIG. 1, at least one embodiment of the present disclosure provides a display substrate. The display substrate includes a scan driving circuit located in an edge area of the display substrate. The scan driving circuit includes a first voltage signal line VGH, a second voltage signal line VGL, a first clock signal line CK, a second clock signal line CB, and a signal output line E0. The scan driving circuit further includes a plurality of shift register units.

As shown in FIG. 1, at least one shift register unit of the plurality of shift register units includes a first capacitor C1, an output capacitor C2, an output reset capacitor C3, an output transistor T10, and an output reset transistor T9, a first transistor T1, a second transistor T2, a third transistor T3, a fourth transistor T4, a fifth transistor T5, a sixth transistor T6, a seventh transistor T7 and an eighth transistor T8.

A gate electrode G10 of the output transistor T10 is coupled to a first electrode plate C2a of the output capacitor C2, a first electrode S10 of the output transistor T10 is coupled to the second voltage signal line VGL, and a second electrode D10 of the output transistor T10 is coupled to the signal output line E0.

A gate electrode G9 of the output reset transistor T9 is coupled to a first electrode plate C3a of the output reset capacitor C3, a first electrode S9 of the output reset transistor T9 is coupled to a second electrode plate C3b of the output reset capacitor C3, a second electrode D9 of the output reset transistor T9 is coupled to the signal output line E0.

The second electrode plate C3b of the output reset capacitor C3 is coupled to the first voltage signal line VGH; the second electrode plate C2b of the output capacitor C2 is coupled to the second clock signal line CB.

A first electrode S1 of the first transistor T1 is coupled to the second clock signal line CB, and a second electrode D1 of the first transistor T1 and a first electrode S2 of the second transistor T2 are respectively coupled to the second electrode plate C1b of the first capacitor C1, and a gate electrode G1 of the first transistor T1 is coupled to the first electrode plate C1a of the first capacitor C1.

A gate electrode G2 of the second transistor T2 and a gate electrode G7 of the seventh transistor T7 are respectively coupled to the first clock signal line CB, and a second electrode D2 of the second transistor T2 is coupled to the second electrode D3 of the third transistor T3; the first electrode S2 of the second transistor T2 is coupled to the second electrode plate C1b of the first capacitor.

A gate electrode G3 of the third transistor T3 is coupled to the gate electrode G10 of the output transistor T10, and a first electrode S3 of the third transistor T3 is coupled to the first voltage signal line VGH.

A gate electrode G4 of the fourth transistor T4 and a gate electrode G5 of the fifth transistor T5 are both coupled to the first clock signal line CK, and a first electrode S4 of the fourth transistor T4 and the first electrode S10 of the output transistor T10 are all coupled to the second voltage signal line VGL, and a second electrode D4 of the fourth transistor T4 is coupled to the second electrode D6 of the sixth transistor T6.

A gate electrode G5 of the fifth transistor T5 is coupled to the first clock signal line CK, a second electrode D5 of the fifth transistor T5 is coupled to a gate electrode G6 of the sixth transistor T6; the first electrode S5 of the fifth transistor T5 is coupled to the input signal end E1.

A first electrode S1 of the sixth transistor T6 and a gate electrode G4 of the fourth transistor T4 are both coupled to the first clock signal line CK, a second electrode D6 of the sixth transistor T6 is coupled to the second electrode D4 of the fourth transistor T4; a gate electrode G6 of the sixth transistor T6 is coupled to a second electrode D1 of the fifth transistor.

A gate electrode G7 of the seventh transistor T7 and the second electrode plate C2b of the output capacitor C2 are both coupled to the second clock signal line CB. A first electrode S7 of the seventh transistor T7 is coupled to the second electrode S7 of the eighth transistor T8. A second electrode D7 of the seventh transistor T7 is coupled to the gate electrode G6 of the sixth transistor T6.

A gate electrode G8 of the eighth transistor T8 is coupled to the gate electrode G1 of the first transistor T1, and a first electrode S8 of the eighth transistor T8 is coupled to the first voltage signal line VGH.

In at least one embodiment of the shift register unit shown in FIG. 1, all the transistors are p-type transistors, but it is not limited thereto.

In at least one embodiment of the present disclosure, the shift register unit shown in FIG. 1 may be a light emitting control scan driving circuit, but it is not limited thereto.

In at least one embodiment of the present disclosure, the first electrode of the transistor may be a source electrode, and the second electrode of the transistor may be a drain electrode; or, the first electrode of the transistor may be a drain electrode, and the second electrode of the transistor may be a source electrode.

In FIG. 1, a node labeled N1 is a first node, a node labeled N2 is a second node, a node labeled N3 is a third node, and a node labeled N4 is a fourth node.

In at least one embodiment shown in FIG. 1, the first voltage signal line VGH can provide a high voltage Vgh, and the second voltage signal line VGL can provide a low voltage Vgl, but it is not limited to this.

Figure 2A:
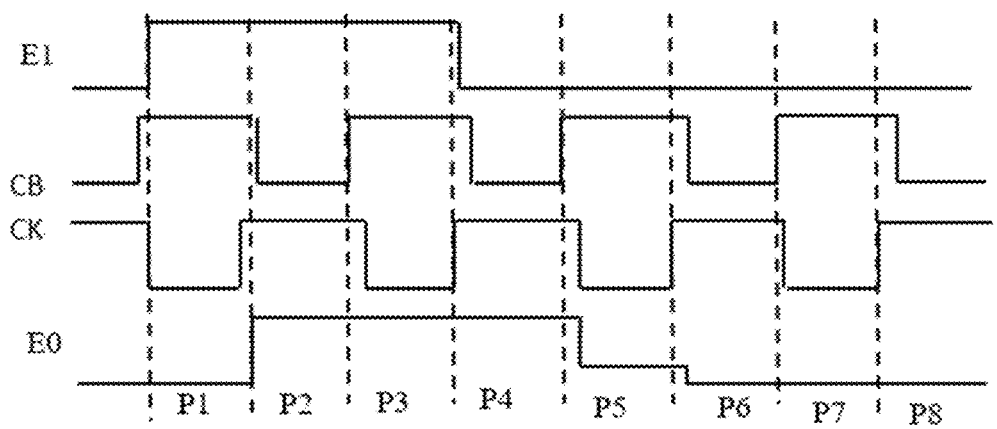
FIG. 2A is a working timing diagram of the shift register unit shown in FIG. 1.

As shown in FIG. 2A, when the shift register unit shown in FIG. 1 of the present disclosure is in operation, the following are implemented.

In a first phase P1, E1 provides a high level, CK provides a low level, CB provides a high level, T5 and T4 are turned on, the potential of N1 is high, T6 is turned off, and the potential of N2 is low, so T7, T3, and T10 are turned off, T8 and T1 are turned on; at this time, the potential of N3 is high, and CB provides a high level, so T2 is turned off; because the voltage across a capacitor will not change suddenly, the potential of N4 remains at a high level of the previous frame, T9 is turned off, the potential of the light emitting control single outputted by E0 remains at the low level of the previous frame.

In a second phase P2, E1 and CK provide a high level, CB provides a low level, T5, T6 and T4 are all turned off, the potential of N1 remains at a high level, the potential of N2 remains at a low level, T7, T8 and T1 are both turned on, the potential of N3 changes from a high level to a low level, T2 is turned on, the potential of N4 is low, T9 is turned on, and E0 outputs a high level; T3 and T10 are both turned off.

In a third phase P3, E1 and CB provide a high level, CK provides a low level, T5 and T4 are both turned on, the potential of N1 is a high level, the potential of N2 is a low level, and T6 and T7 are both turned off. T8 and T1 are both turned on, the potential of N3 changes from the low level of the previous phase to the high level, T2 is turned off, the potential of N4 remains at a low level, T9 is turned on, and E0 outputs a high level; T3 and T10 are both turned off.

In a fourth phase P4, E1 and CB provide a low level, CK provides a high level, T5 and T4 are both turned off, the potential of N1 is a high level, T6 is turned off, and the potential of N2 remains at a low level, T7, T8 and T1 are both turned on, the voltage of N3 is changed to a low level, T2 is turned on, the potential of N4 is low, T9 is turned on, E0 outputs a high level; T3 and T10 are both turned off.

In a fifth phase P5, E1 and CK provide a low level, CB provides a high level, T5, T6 and T4 are all turned, the potential of N1 and N2 are both low, T7 is turned off, and T7 and T1 are both turned on, the voltage of N3 is changed to a high level, T2 is turned off, T3 is turned on, the voltage of N4 is changed to a high level, T9 is turned off, T10 is turned on, and E0 outputs a low level.

In a sixth phase P6, the E1 and CB signals are at a low level, CK is at a high level, T1 and T3 are turned off, the voltage of node N1 remains at a low level, T2 is turned on, the voltage of node N2 is at high level, and T4 and T5 are turned on. T6 is turned off, the voltage of node N3 is at a high level, T7, T8 are turned on, the voltage of node N4 is at a high level, T9 is turned off, T10 is turned on, and Eout outputs a low level.

In a seventh phase P7, E1 and CK provide a low level, CB provides a high level, T5, T6 and T4 are all turned on, the potential of N1 and N2 are both low, T7 is turned off, T8 and T1 are both turned on, the potential of N3 is high, T2 is turned off, T3 is turned on, the potential of N4 is high, T9 is turned off, T10 is turned on, and E0 outputs a low level.

In an eighth phase P8, E1 and CB provide a low level, CK provides a high level, T5 and T4 are both turned off, the potential of N1 remains at a low level, T6 is turned on, the potential of N2 is a high level, and T7 is turned on, T8 and T1 are both turned off, the potential of N3 is a high level, T2 and T3 are both turned on, the voltage of N4 is a high level, T9 is turned off, T10 is turned on, and E0 outputs a low level.

After the sixth phase, T3 continues to be turned on, T9 continues to be turned off, T5 periodically charges C2, the potential of N1 remains at a low level, T10 continues to be turned on, and E0 outputs a low level until E1 receives the input signal in the next frame.

Figure 2B:
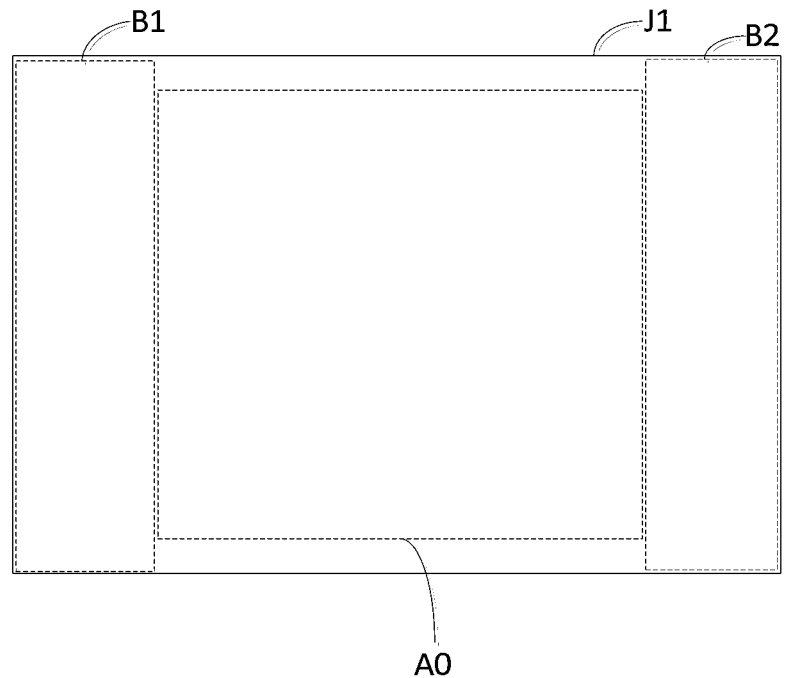
FIG. 2B is a schematic diagram of the area division of the display substrate according to at least one embodiment of the present disclosure.

As shown in FIG. 2B, the label J1 represents the display substrate, the label A0 represents the display area, the label B1 represents the first edge area, and the label B2 represents the second edge area.

The display area A0 of the display substrate J1 may be provided with a plurality of light emitting control lines, a plurality of gate lines, and a plurality of data lines, and a plurality of sub-pixels defined by the intersection of the plurality of gate lines and the plurality of data lines.

A scan driving circuit may be provided in the first edge area B1 and/or the second edge area B2, the scan driving circuit including a plurality of shift register units.

The signal output line of each shift register unit of the plurality of shift register units included in the scan driving circuit may be respectively coupled to A light emitting control lines for providing a light emitting control signal to the corresponding light emitting control line.

A can be a positive integer. In actual operation, A can be equal to 1, 2, 3, 4 or other positive integers, and the value of A can be selected according to actual conditions.

In specific implementation, the light emitting control line is coupled to the light emitting control end of the pixel circuits in the corresponding row.

Optionally, the display substrate further includes a plurality of rows of pixel circuits arranged on the base substrate; the pixel circuit includes a light emitting control end.

The shift register unit included in the scan driving circuit corresponds to at least one row of the pixel circuits.

The signal output line of the shift register unit is coupled to the light emitting control end of the at least one row of pixel circuits, and is used to provide the light emitting control signal to the light emitting control end of the at least one row of pixel circuits.

In at least one embodiment of the present disclosure, the pixel circuit may be arranged in an effective display area of the display substrate, and the scan driving circuit may be arranged in the edge area of the display substrate.

Figure 2C:
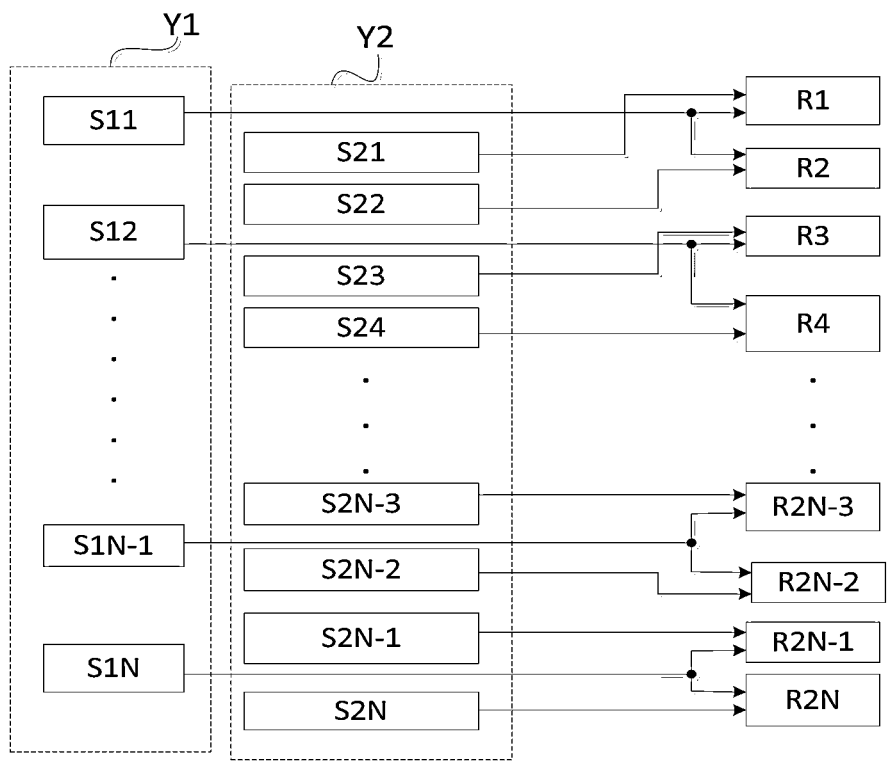
FIG. 2C is a schematic diagram of the connection relationship between the scan driving circuit and the pixel circuit included in the display substrate according to at least one embodiment of the present disclosure.

As shown in FIG. 2C, Y1 is the scan driving circuit, S11 is the first stage of shift register unit included in the scan driving circuit S1, and S12 is the second stage of shift register unit included in the scan driving circuit S1, S1N-1 is the (N-1)th stage of shift register unit included in the scan driving circuit S1, and S1N is the Nth stage of shift register unit included in the scan driving circuit, N is an integer greater than 3.

In FIG. 2C, R1 is the pixel circuit in the first row, R2 is the pixel circuit in the second row, R2 is the pixel circuit in the third row, and the R4 is the pixel circuit in the fourth row. R2N-3 is the pixel circuit in the (2N-3)th row, R2N-2 is the pixel circuit in the (2N-2)th row, R2N-1 is the pixel circuit in the (2N-1)th row, and R2N is the pixel circuit in the (R2N)th row.

S11 provides a lighting control signal for R1 and R2, S12 provides a lighting control signal for R3 and R4, S1N-1 provides a lighting control signal for R2N-3 and R2N-2, and S1N provides a lighting control signal for R2N-1 and R2N.

As shown in FIG. 2C, in the edge area, the display substrate may further include a gate driving circuit, the gate driving circuit includes a plurality of stages of gate driving units, and the gate driving units may correspond to pixel rows in a one-to-one manner, and is configured to provide corresponding gate driving signals for corresponding rows of pixels.

In FIG. 2C, Y2 is the gate driving circuit, S21 is the first row of gate driving units included in the gate driving circuit, and S22 is the second row of gate driving units included in the gate driving circuit, S23 is the third row of gate driving units included in the gate driving circuit, S24 is the fourth row of gate driving units included in the gate driving circuit, S2N-3 is the (2N-3)th row of gate driving units included in the driving circuit, S2N-2 is the (2N-2)th row of gate driving units included in the gate driving circuit, and S2N-1 is the (2N-2)th row of gate driving units included in the gate driving circuit, S2N is the 2Nth row gate driving units included in the gate driving circuit.

Figure 2D:
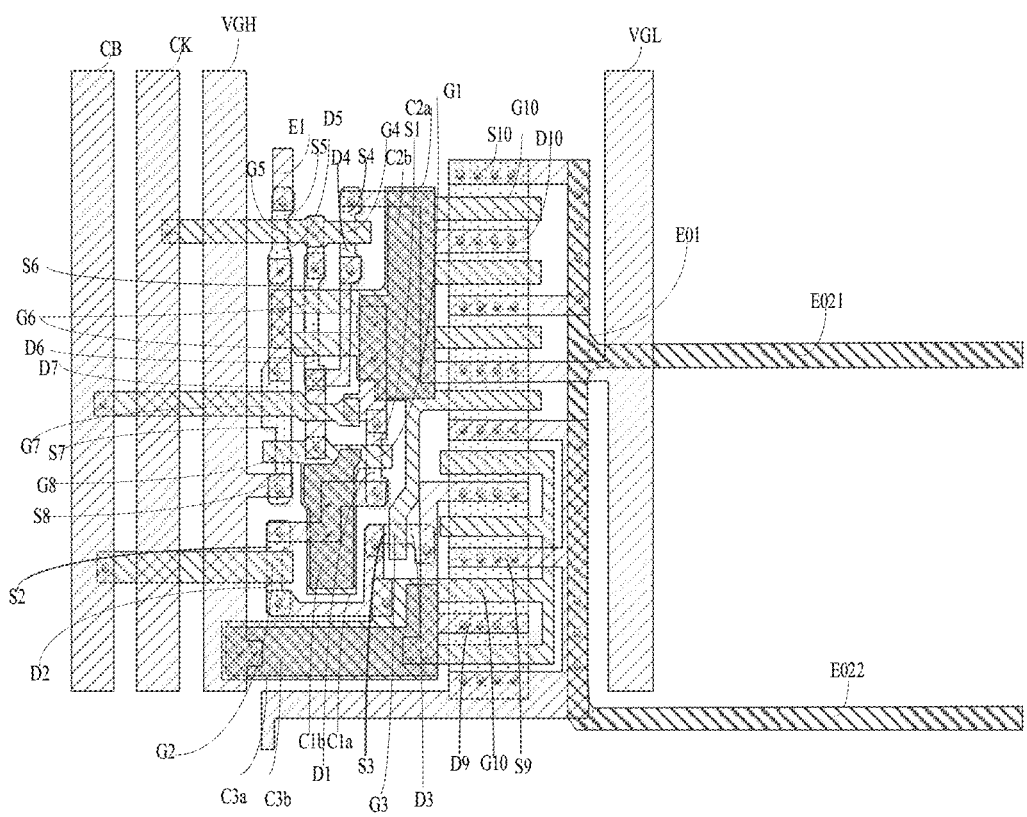
FIG. 2D is a schematic diagram of a layout of a shift register unit according to at least one embodiment of the present disclosure.

In at least one embodiment shown in FIG. 2D, the first voltage signal line VGH provides a high voltage signal Vgh, and the second voltage signal line VGL provides a low voltage signal Vgl.

As shown in FIG. 2D, VGL, VGH, CK, and CB are arranged in a direction away from the display area; VGH, VGL, CK, and CB extend in the first direction.

As shown in FIGS. 1 and 2D, the shift register unit includes a first capacitor C1, an output capacitor C2, an output reset capacitor C3, an output transistor T10, an output reset transistor T9, a first transistor T1, a second transistor T2, a third transistor T3, a fourth transistor T4, a fifth transistor T5, a sixth transistor T6, a seventh transistor T7 and an eighth transistor T8; the shift register unit is arranged between VGH and VGL.

T10 and T9 are arranged along the first direction.

C2 is arranged on a side of T10 away from VGL, and T5, T6 and T4 are arranged between C2 and VGH.

T1 and T3 are arranged on a side of T9 away from VGL, C1 is arranged on a side of T3 away from T9, and T8 and T2 are arranged on a side of C1 away from T8.

T5, T7, T8, T2 and C3 are arranged in sequence along the first direction, T6, C1 and C3 are arranged in sequence along the first direction, and C2, T1, T3 and C3 are arranged in sequence along the first direction.

T1 includes a first active pattern, and the first active pattern of T1 is arranged vertically, which is not conducive to the compact arrangement between T2 and T3.

The second electrode plate C3b of C3 has a longer width in the lateral direction, which is not conducive to reduce the width of the shift register unit in the second direction.

In FIG. 2D, E01 is the first output line part of the signal output line, E021 is a first second output line part of the signal output line, and E022 is a second second output line part of the signal output line. E01 is arranged in the first direction, E021 is arranged in the second direction, E01, E021 and E022 are coupled to each other, the first direction intersects the second direction, E01 is arranged between the VGL and the output circuit (the output circuit includes the output transistor T10 and the output reset transistor T9), E021 and E022 extend to the display area along the second direction, so as to provide the light emitting control signals for the pixel circuit in the display area.

As shown in FIG. 2D, S7 is multiplexed as D8.

Figure 3A:
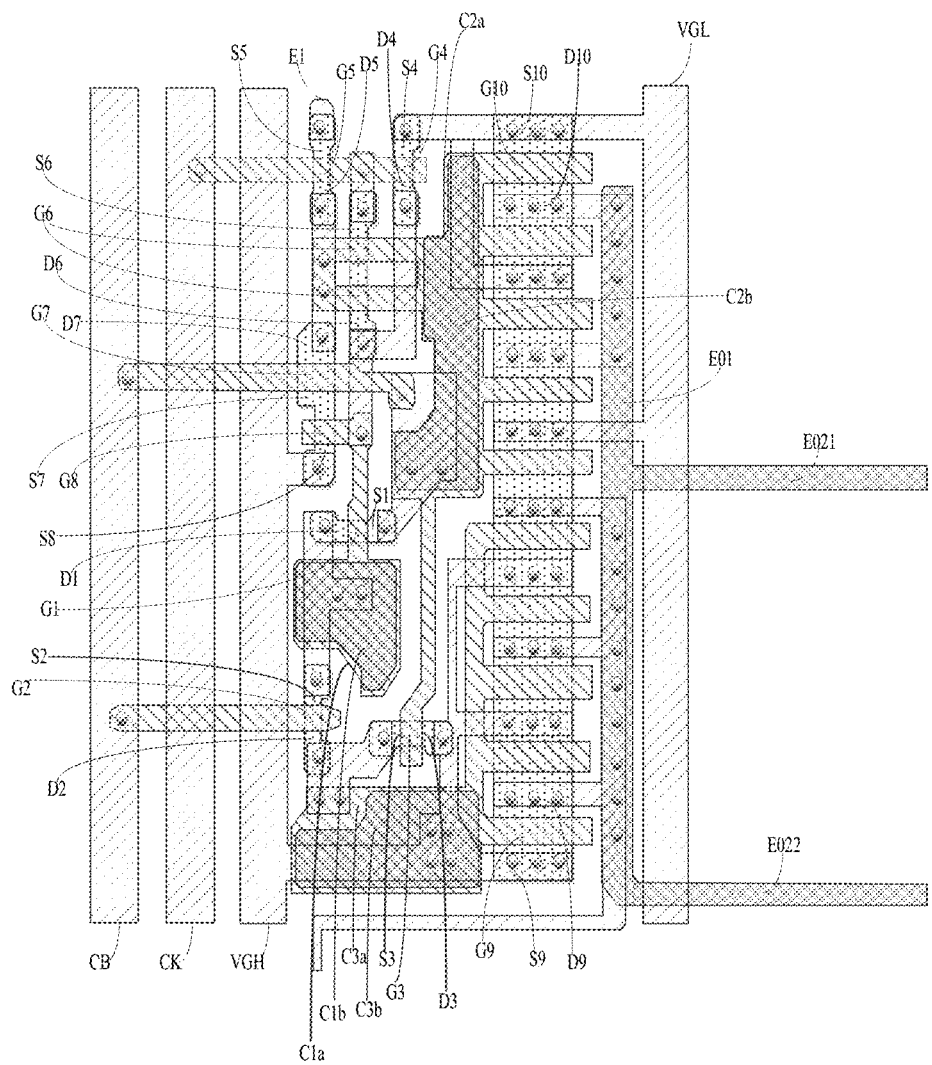
FIG. 3A is a schematic diagram of another layout of the shift register unit according to at least one embodiment of the present disclosure.

In FIGS. 2D and 3A, G1 is the gate electrode of T1, S1 is the first electrode of T1, D1 is the second electrode of T1; G2 is the gate electrode of T2, S2 is the first electrode of T2, D2 is the second electrode of T2; G3 is the gate electrode of T3, S3 is the first electrode of T3, and D3 is the second electrode of T3; G4 is the gate electrode of T4, S4 is the first electrode of T4, D4 is the second electrode of T4; G5 is the gate electrode of T5, S5 is the first electrode of T5, D5 is the second electrode of T5; G6 is the gate electrode of T6, S6 is the first electrode of T6, D6 is the second electrode of T6; G7 is the gate electrode of T7, S7 is the first electrode of T7, D7 is the second electrode of T7; G8 is the gate electrode of T8, S8 is the first electrode of T8, D8 is the second electrode of T8; G9 is the gate electrode of T9, S9 is the first electrode of T9, D9 is the second electrode of T9; G10 is the gate electrode of T10, S10 is the first electrode of T10, D10 is the second electrode of T10.

In at least one embodiment shown in FIG. 2D, the first direction may be a vertical direction from top to bottom, and the second direction may be a horizontal direction from right to left, but is not limited to this. In actual operation, the first direction can also be a vertical direction from bottom to top, and the second direction can also be a horizontal direction from left to right; or the first direction can also be other directions, and the second direction can be in other directions.

In the layout of the gate driving circuit shown in FIG. 2D, the active layer of T9 and the active layer of T9 are formed by a continuous first semiconductor layer, and the length of the first semiconductor layer in the first direction is relatively small, the entire vertical space of the shift register unit is relatively small, which will result in a larger width of the shift register unit in the horizontal direction, which is not conducive to the close arrangement of the devices in the shift register unit in the horizontal direction, and is not conducive to reduce the frame width of the display substrate.

The shift register unit shown in FIG. 2D may be the nth stage of shift register unit included in the scan driving circuit, and n is a positive integer.

Based on the existence of the above-mentioned problems, the layout of the transistors in the shift register unit can be adjusted to reduce the occupied area of the shift register unit, thereby reducing the frame width of the display substrate.

In the layout shown in FIG. 3A, the first voltage signal line VGH provides a high voltage signal Vgh, and the second voltage signal line VGL provides a low voltage signal Vgl; shift register unit is arranged between VGH and VGL.

In FIG. 3A, E01 is the first output line of the signal output line, E021 is the first second output line of the signal output line, and E022 is the second output line of the signal output line. E01 is arranged in the first direction, E021 is arranged in the second direction, E01, E021 and E022 are coupled to each other, and the first direction intersects the second direction. As shown in FIG. 3A, E01 is arranged between the VGL and the output circuit, and E021 and E022 extend to the display area along the second direction, so as to provide the light emitting control signal for the pixel circuits in the display area.

For example, in the layout shown in FIG. 3A, the first direction may be a vertical direction from top to bottom, and the second direction may be a horizontal direction from right to left, but it is not limited to this.

The shift register unit shown in FIG. 3A may be the nth stage of shift register unit included in the scan driving circuit, and n is a positive integer.

As shown in FIGS. 1 and 3A, the shift register unit includes a first capacitor C1, an output capacitor C2, an output reset capacitor C3, an output transistor T10, an output reset transistor T9, a first transistor T1, a second transistor T2, a third transistor T3, a fourth transistor T4, a fifth transistor T5, a sixth transistor T6, a seventh transistor T7 and an eighth transistor T8; as shown in FIG. 3A, the output circuit 01 includes the output transistor T10 and the output reset transistor T9.

The gate electrode G10 of the output transistor T10 is coupled to the first electrode plate C2a of the output capacitor C2, the first electrode S10 of the output transistor T10 is coupled to the second voltage signal line VGL, and the second electrode D10 of the output transistor T10 is coupled to the first output line part E01 included in the signal output line.

The gate electrode G9 of the output reset transistor T9 is coupled to the first electrode plate C3a of the output reset capacitor C3, the first electrode S9 of the output reset transistor T9 is coupled to the second electrode plate C3b of the output reset capacitor C3, the second electrode D9 of the output reset transistor T9 is coupled to the first output line part E01 included in the signal output line.

In the layout of the gate driving circuit shown in FIG. 3A, the active layer of T9 and the active layer of T10 may be formed by a continuous first semiconductor layer, and the length of the first semiconductor layer in the first direction is increased, so that other devices included in the shift register unit can use the extra space in the vertical direction, reduce the width of the shift register unit in the horizontal direction, which is conducive to the close arrangement of the devices in the shift register unit in the horizontal direction, and the development of the narrow frame of the display substrate.

As shown in FIG. 3A, when the shift register unit of the above structure is arranged in the edge area of the display substrate, the second voltage signal line VGL, the first voltage signal line VGH, the first clock signal line CK and the second clock signal line CB are arranged in sequence along the direction away from the display area of the display substrate; the second voltage signal line VGL, the first voltage signal line VGH, the first clock signal line CK and the second clock signal line CB all extend along the first direction.

As shown in FIG. 3A, the first capacitor C1, the output capacitor C2, the output reset capacitor C3, the output transistor T10, the output reset transistor T9, the first transistor T1, the second transistor T2, the third transistor T3, the fourth transistor T4, the fifth transistor T5, the sixth transistor T6, the seventh transistor T7 and the eighth transistor T8 are all arranged between VGH and VGL; T5, T6, T4, T7 and T8 are all moved up to utilize the increased length of the first semiconductor layer in the first direction.

T1 includes the first active pattern, and the first active pattern of T1 extends along the second direction, and T1 is arranged between T8 and C1, and T8, T1 and C1 are arranged in sequence along the first direction, thereby using the space between C1 and T8 to arrange T1, so that T2 and T3 can be arranged more compactly (the second electrode D2 of the second transistor T2 is coupled to the second electrode D2 of the third transistor T3, T2 is arranged to close to T3 for facilitating the wiring), which can further reduce the width in the second direction occupied by the shift register unit.

Moreover, in the layout shown in FIG. 3A, the shape of C1 is more in line with the arrangement positions of T1, T2, and T3, and the space between T1, T2, and T3 is used to arrange the electrode plate of C1.

In the layout shown in FIG. 3A, the width of the second electrode plate C3b of C3 in the second direction is set to be smaller, and the length of the second electrode plate C3b of C3 in the first direction is set to be larger, under the premise of ensuring the area of the electrode plate of C3, the width in the second direction occupied by the electrode plate of C3 is reduced.

As shown in FIG. 3A, an orthographic projection of the second electrode plate C3b of C3 on the base substrate is within an orthographic projection of the first electrode plate C3a of C3 on the base substrate.

Figure 6:
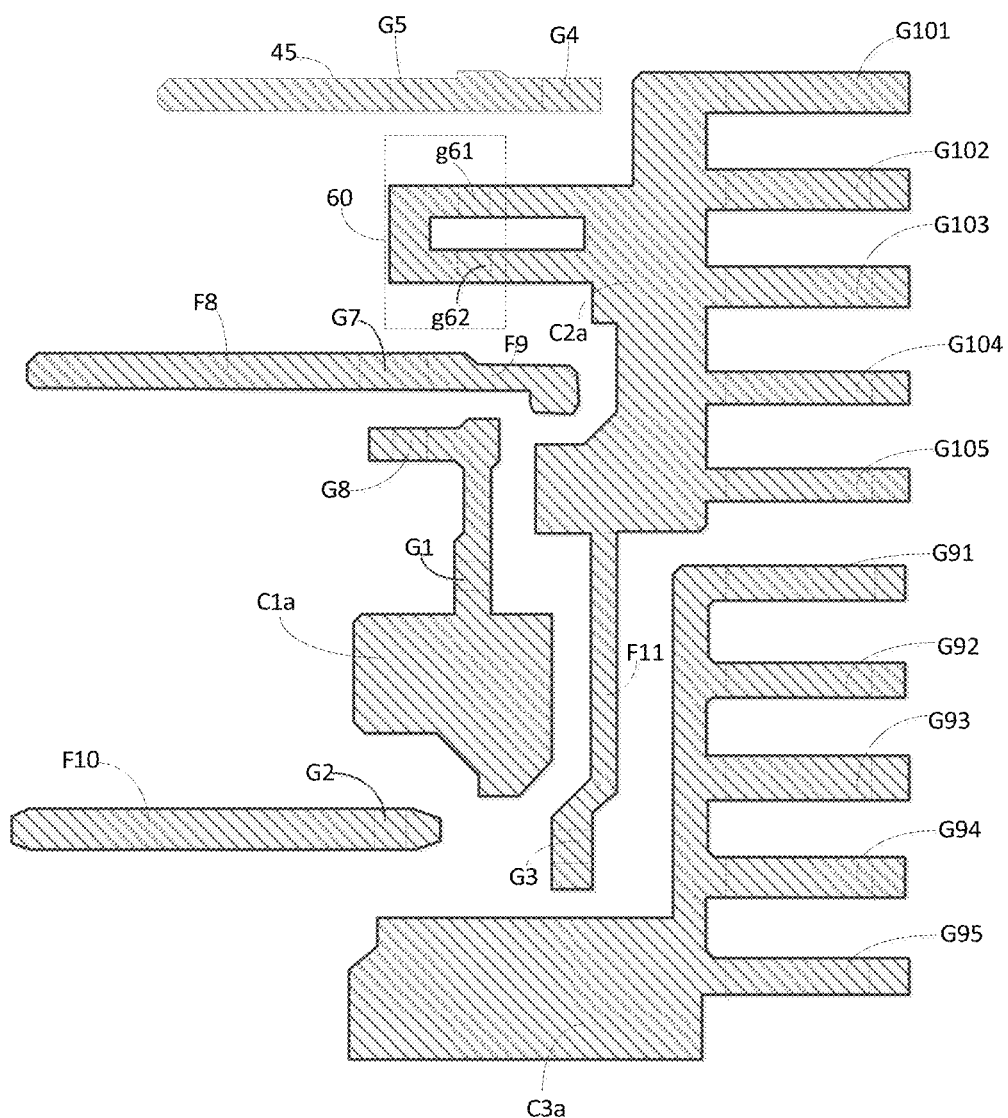
FIG. 6 is a schematic diagram of a first gate metal layer in the shift register unit according to at least one embodiment of the present disclosure.

As shown in FIGS. 3A and 6 (FIG. 6 is a schematic diagram of the first gate metal layer in FIG. 3A), the gate electrode G6 of T6 includes a first gate pattern G61 and a second gate pattern G62 that are coupled to each other, so that T6 is formed as a double gate structure.

The purpose of the double-gate structure design is: in the second phase P2, when the shift register unit included in the scan driving circuit outputs a high voltage signal Vgh, T10 should be completely turned off, and the high level applied to the gate electrode of T10 is inputted by the source electrode of T8. Therefore, in the second phase P2, it is necessary to ensure that T8 is turned on, that is, the potential of the second node N2 needs to be low; and in the second phase P2, the potential of the gate electrode of T6 is high, to ensure that the potential of the second node N2 does not increase due to the current leakage of T6, so T6 is designed in a double-gate structure, which makes it easier to turn off T6.

In at least one embodiment of the present disclosure, the first direction intersects the second direction, for example, the first direction may be perpendicular to the second direction, but it is not limited thereto.

Specifically, the angle between the second direction and the first direction can be set according to actual needs. For example, the second direction is perpendicular to the first direction.

In at least one embodiment of the present disclosure, the position of the first clock signal line CB and the position of the second clock signal line CK can be interchanged, but this is limited.

Figure 5:
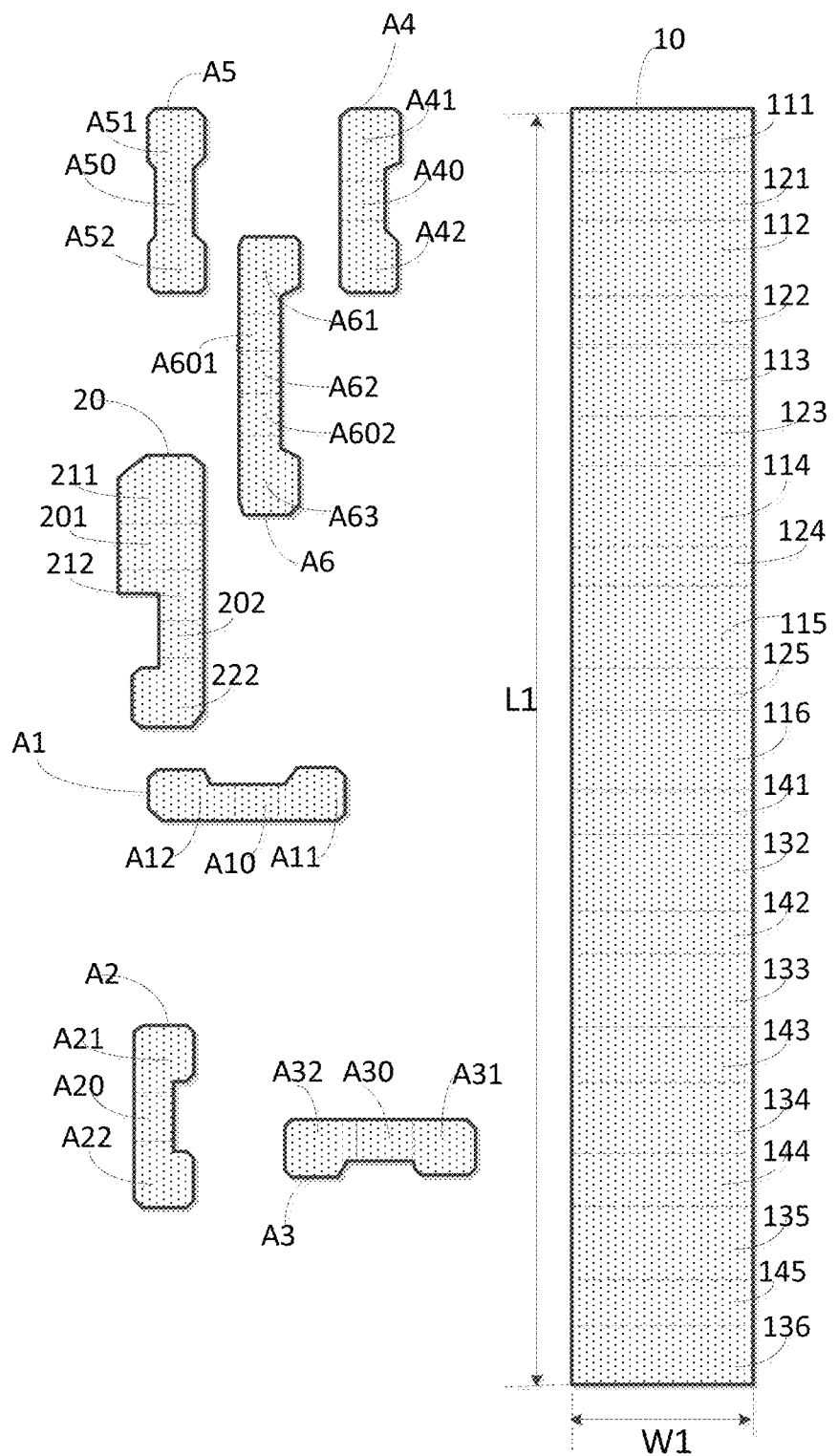
FIG. 5 is a schematic diagram of an active layer in a shift register unit according to at least one embodiment of the present disclosure.

In the layout shown in FIG. 3A, as shown in FIG. 5 (FIG. 5 is a schematic diagram of the active layer in FIG. 3A), the length of the first semiconductor layer 10 in the first direction is an output active length L1, so the minimum width of the first semiconductor layer 10 in the second direction is an output active width W1.

The output active length L1 is a first predetermined length.

The ratio of the output active length L1 to the output active width W1 is within a predetermined ratio range.

The output active width W1 is within a predetermined width range.

In at least one embodiment of the present disclosure, the output active length L1 is increased, so that the devices in the shift register unit other than the output circuit can utilize a longitudinal space for layout, the longitudinal space is generated due to the increase in L1, so that the lateral space occupied by the shift register unit is reduced. In at least one embodiment of the present disclosure, the output active width W1 is reduced, so that devices other than the output circuit in the shift register unit can use the saved horizontal space for layout, so as to reduce the horizontal space occupied by the shift register unit.

In at least one embodiment of the present disclosure, the predetermined ratio range may be greater than or equal to 3 and less than or equal to 11, but is not limited thereto.

In at least one embodiment of the present disclosure, the predetermined width range may be greater than or equal to 12 um and less than or equal to 45 um, but is not limited thereto.

In at least one embodiment of the present disclosure, the first predetermined length may be greater than or equal to 50 um and less than or equal to 130 um, but is not limited thereto.

Figure 8:
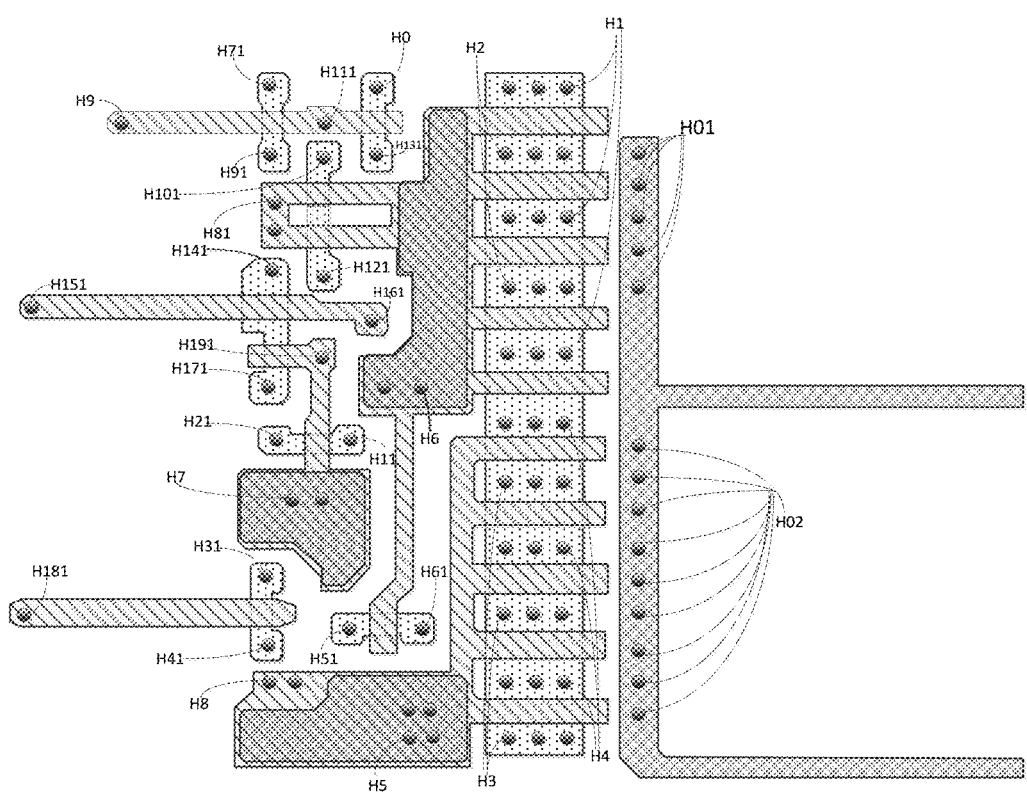
FIG. 8 is a schematic diagram of a via hole used in the shift register unit according to at least one embodiment of the present disclosure.

As shown in FIGS. 3A and 8, the first output line part E01 is coupled to the second electrode D10 of the output transistor T10 through a plurality of first signal line via holes H01 arranged in a signal line overlap area, and the first output line part E01 is coupled to the second electrode D9 of the output reset transistor T9 through a plurality of second signal line via holes H02 arranged in the signal line overlap area; the plurality of first signal line via holes H01 is sequentially arranged along the first direction, and the plurality of second signal line via holes H02 are sequentially arranged along the first direction.

Figure 4:
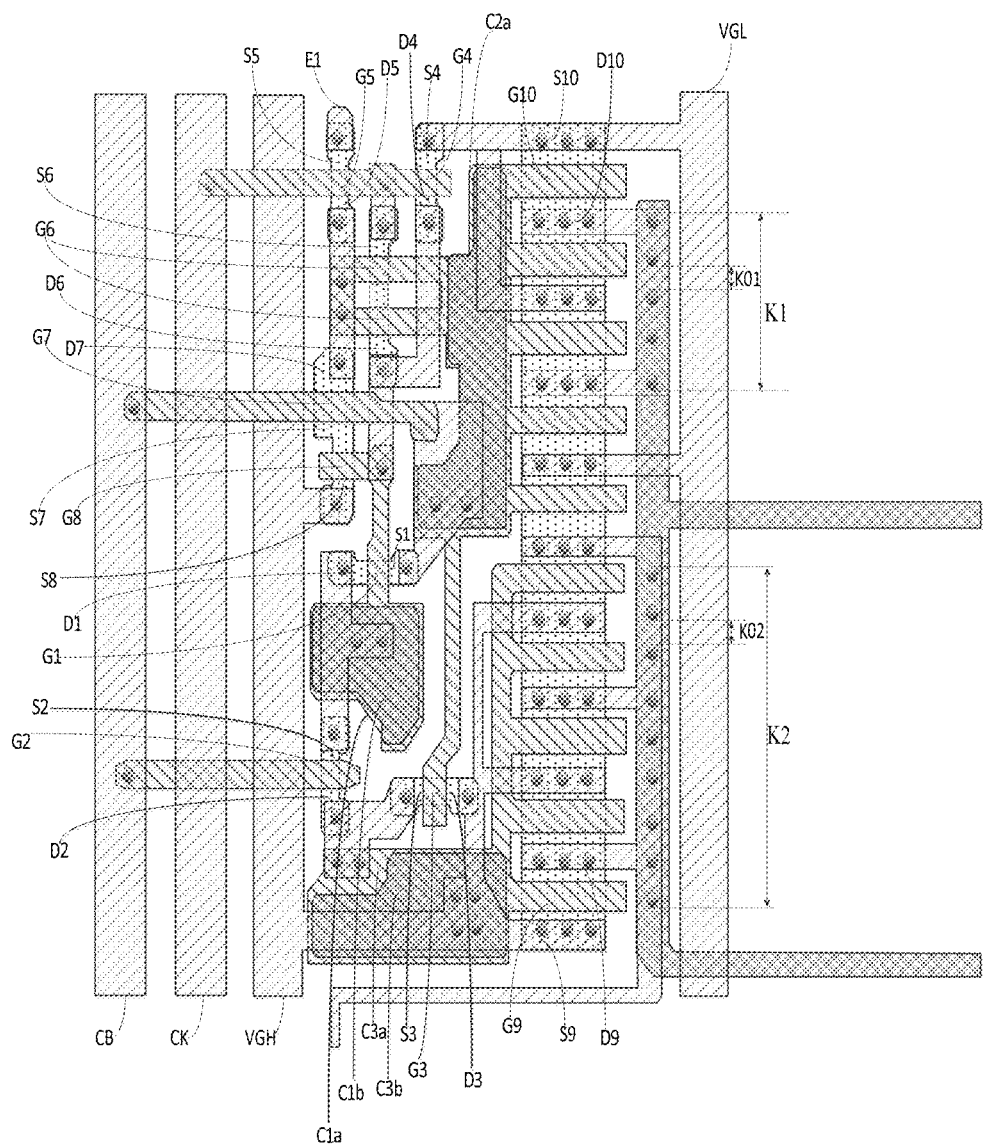
FIG. 4 is a schematic diagram showing the maximum distance K1 in the first direction between the first first signal line via hole and the last first signal line via hole arranged in sequence along the first direction, and the maximum distance K2 in the first direction between the first second signal line via hole and the last second signal line via hole arranged in sequence along the first direction on the basis of FIG. 3A.
Figure 10:
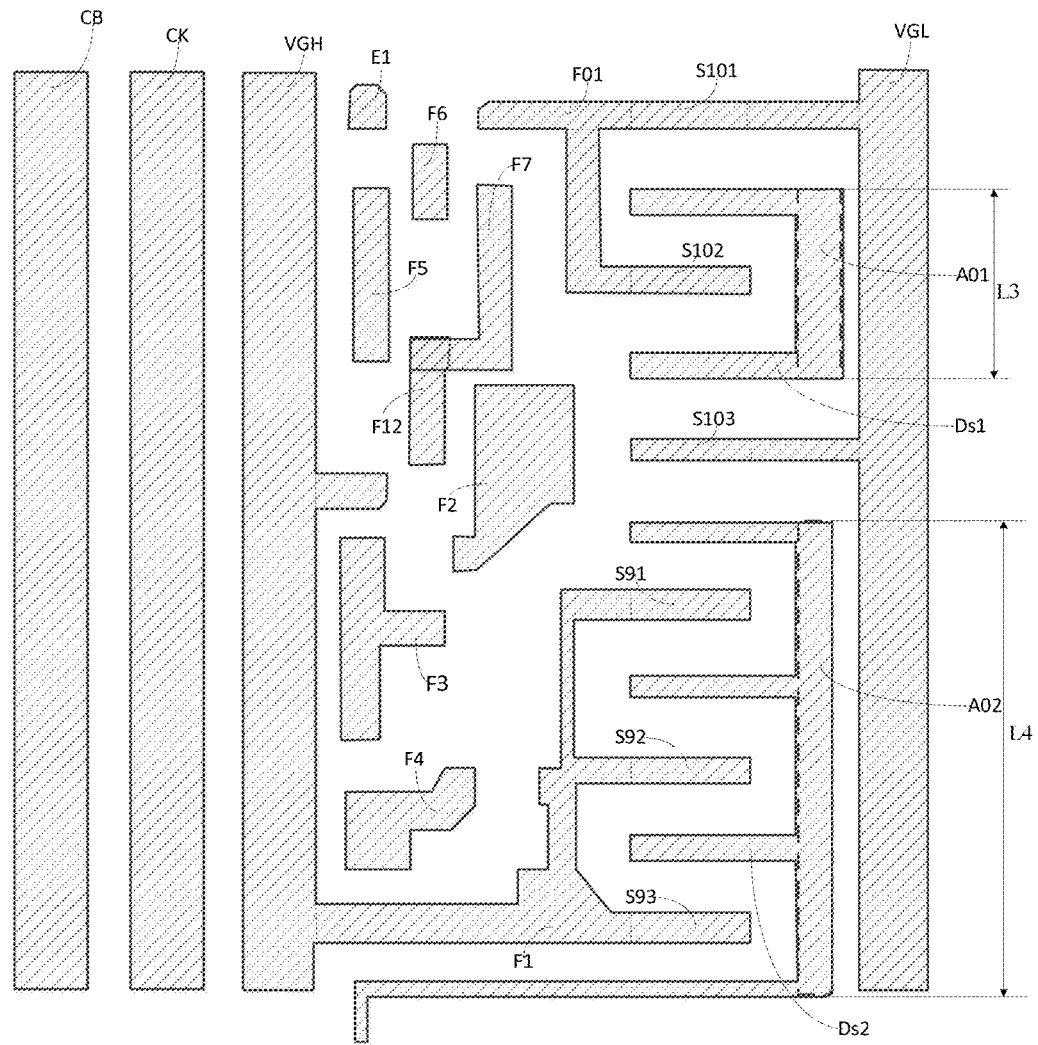
FIG. 10 is a schematic diagram of the source-drain metal layers in FIG. 3A.

FIGS. 4 and 10 (FIG. 10 is a schematic diagram of the source-drain metal layer in FIG. 3A, and a first source-drain metal pattern Ds1 and a second source-drain metal pattern Ds2 are shown in FIG. 10), the signal line overlap area includes a first signal line overlap area A01 and a second signal line overlap area A02. The first signal line overlap area A01 is an area where the orthographic projection of the first output line portion E01 on the base substrate overlaps the orthographic projection of the first source-drain metal pattern Ds1 on the base substrate, the second electrode D10 of the output transistor T10 is included in the first source-drain metal pattern Ds1. The second signal line overlap area A02 is an area where the orthographic projection of the first output line portion E01 on the base substrate overlaps the orthographic projection of the second source-drain metal pattern Ds2 on the base substrate; the second electrode D9 of the output reset transistor T9 is included in the second source-drain metal pattern Ds2.

As shown in FIGS. 4 and 10, the ratio of the maximum distance K1 in the first direction between the first first signal line via hole and the last first signal line via hole arranged in the first direction to the third length L3 is a third predetermined ratio; the minimum distance in the first direction between two adjacent first signal line via holes is the first predetermined distance; the third length L3 is the length of the first signal line overlap area A01 in the first direction.

The ratio of the maximum distance K2 in the first direction between the first second signal line via hole and the last second signal line via hole arranged in sequence along the first direction to the fourth length L4 is a fourth predetermined ratio. The minimum distance in the first direction between adjacent second signal line via holes is the second predetermined distance; the fourth length L4 is the length of the second signal line overlap area A02 in the first direction.

In at least one embodiment of the present disclosure, the number of the first signal line via holes and the number of the second signal line via holes can be selected according to actual conditions.

In at least one embodiment of the present disclosure, the maximum distance in the first direction between any two first signal line via holes arranged in sequence along the first direction refers to: the maximum distance in the first direction between the edges of the orthographic projections of any two first signal line via holes on the base substrate.

The maximum distance K1 in the first direction between the first first signal line via hole and the last first signal line via hole arranged in sequence along the first direction refers to: the maximum distance in the first direction between the edge of the orthographic projection of the first first signal line via hole on the base substrate and the edge of the orthographic projection of the last first signal line via hole on the base substrate.

The minimum distance K01 between two adjacent first signal line via holes in the first direction refers to: the minimum distance in the first direction between the edges of the orthographic projections of two adjacent first signal line via holes on the base substrate.

The maximum distance K2 in the first direction between the first second signal line via hole and the last second signal line via hole arranged in sequence along the first direction refers to: the maximum distance in the first direction between the edge of the orthographic projection of the first second signal line via hole on the base substrate and the edge of the orthographic projection of the last second signal line via hole on the base substrate.

The maximum distance in the first direction between any two second signal line via holes arranged in sequence along the first direction refers to the maximum distance in the first direction between the edges of the orthographic projections of any two second signal line via holes on the base substrate.

The minimum distance K02 between two adjacent second signal line via holes in the first direction refers to: the minimum distance in the first direction between the edges of the orthographic projections of two adjacent second signal line via holes on the base substrate.

In at least one embodiment of the present disclosure, the first predetermined ratio may be greater than or equal to 0.05 and less than or equal to 0.9, but is not limited thereto;

The first predetermined distance may be greater than or equal to 1.5 um and less than or equal to 45 um, but is not limited to this;

The second predetermined ratio may be greater than or equal to 0.05 and less than or equal to 0.9, but is not limited to this;

The second predetermined distance may be greater than or equal to 1.5 um and less than or equal to 65 um, but is not limited to this.

As shown in FIGS. 3A, 4 and 10, since the active layer of T10 and the active layer of T9 are elongated longitudinally, the third length L3 and the fourth length L4 are correspondingly increased, so that a plurality of first signal line via holes H01 can be evenly arranged in the first signal line overlap area A01, and the ratio of the maximum distance K1 in the first direction between the first first signal line via hole from top to bottom and the last first signal line via from top to bottom to the third length L3 is the third predetermined ratio, and the plurality of first signal line via holes H01 can fill the first signal line overlap area A01 as much as possible, so that the second electrode D10 of the output transistor T10 can be coupled to E01 in a better way.

As shown in FIGS. 3A, 4, and 10, since the active layer of T10 and the active layer of T9 are elongated longitudinally, the third length L3 and the fourth length L4 are correspondingly increased, so that a plurality of second signal line via holes H02 can be evenly arranged in the second signal line overlap area A02, and the ratio of the maximum distance K2 in the first direction between the first second signal line via hole from top to bottom and the last second signal line via hole from top to bottom to the fourth length L4 is the fourth predetermined ratio, and the plurality of second signal line via holes H02 can fill the second signal line overlap area A02 as much as possible, so that the second electrode of the output reset transistor T9 D9 can be coupled to E01 in a better way.

In at least one embodiment of the present disclosure, the third predetermined ratio can be greater than or equal to 0.05 and less than or equal to 0.9; the fourth predetermined ratio is greater than or equal to 0.05 and less than or equal to 0.9, but not limited to this.

The display substrate according to at least one embodiment of the present disclosure includes a scan driving circuit and a display area provided on the base substrate; the scan driving circuit includes a plurality of shift register units, and at least one of the plurality of shift register units includes a signal output line and an output circuit, and the output circuit includes an output transistor and an output reset transistor.

The signal output line includes a first output line portion extending in a first direction.

The first output line portion is coupled to the second electrode of the output transistor through a plurality of first signal line via holes arranged in the signal line overlap area, and the first output line portion is coupled to the second electrode of the output reset transistor through the plurality of second signal line via holes arranged in the signal line overlap area; the plurality of first signal line via holes is arranged in sequence along the first direction, and the plurality of second signal line via holes is arranged in sequence along the first direction.

The signal line overlap area includes a first signal line overlap area and a second signal line overlap area, and the first signal line overlap area is an area where the orthographic projection of the first output line portion on the base substrate overlaps the orthographic projection of the first source-drain metal pattern on the base substrate, the second electrode of the output transistor is included in the first source-drain metal pattern, the second signal line overlap area is an area where the orthographic projection of the first output line portion on the base substrate overlaps the orthographic projection of the second source-drain metal pattern on the base substrate, the second electrode of the output reset transistor is included in the second source-drain metal pattern.

The ratio of the maximum distance in the first direction between any two first signal line via holes arranged in sequence along the first direction to the third length is the first predetermined ratio; the minimum distance in the first direction between two adjacent first signal line via holes is a first predetermined distance; the third length is the length of the first single line overlap area in the first direction.

The ratio of the maximum distance in the first direction between any two second signal line via holes arranged in sequence along the first direction to the fourth length is the second predetermined ratio; the minimum distance in the first direction between two adjacent second signal line via holes is the second predetermined distance; the fourth length is the length of the second signal line overlap area in the first direction.

The first predetermined ratio is greater than or equal to 0.05 and less than or equal to 0.9.

The first predetermined distance is greater than or equal to 1.5 um and less than or equal to 45 um.

The second predetermined ratio is greater than or equal to 0.05 and less than or equal to 0.9.

The second predetermined distance is greater than or equal to 1.5 um and less than or equal to 65 um.

Optionally, the active layer of the output transistor and the active layer of the output reset transistor are arranged along a first direction, and the length of the active layer of the output transistor in the first direction is a first length, the length of the active layer of the output reset transistor in the first direction is a second length, and the sum of the first length and the second length is an output active length.

The smaller one among the minimum width of the active layer of the output transistor in the second direction and the minimum width of the active layer of the output reset transistor in the second direction is the output active width; the first direction intersects the second direction.

In at least one embodiment of the present disclosure, the ratio of the output active length to the output active width is within a predetermined ratio range; the predetermined ratio range is greater than or equal to 3 and less than or equal to 11, but not limit thereto.

In at least one embodiment of the present disclosure, the output active length is increased, so that the devices in the shift register unit other than the output circuit can use the extra vertical space for layout due to the increase of the output active length, and the horizontal space occupied by the shift register unit is reduced. Moreover, in at least one embodiment of the present disclosure, since the active layer of the output transistor and the active layer of the output reset transistor are elongated longitudinally, the third length and the fourth length are correspondingly longer, so that the plurality of first signal line via holes may be evenly arranged in the first signal line overlap area, and the ratio of the maximum distance between any two first signal line via holes in the first direction to the third length is a first predetermined ratio, and the plurality of first signal line via holes can fill the first signal line overlap area be as much as possible, so that the second electrode of the output transistor can be coupled to the first output line portion in a better way.

As shown in FIG. 3A, FIG. 4 and FIG. 10, since the active layer of the output transistor and the active layer of the output reset transistor are elongated longitudinally, the third length and the fourth length are longer, so that a plurality of second signal line via holes may be evenly arranged in the second signal line overlap area, and the ratio of the maximum distance between any two second signal line via holes in the first direction to the fourth length is the second predetermined ratio, the plurality of second signal line via holes can fill the second signal line overlap area as much as possible, so that the second electrode of the output reset transistor can be coupled to the first output line portion in a better way.

In at least one embodiment of the present disclosure, the output active width may be within a predetermined width range.

In at least one embodiment of the present disclosure, the output active width is reduced, so that devices in the shift register unit other than the output circuit can utilize the saved horizontal space for layout, and the horizontal space occupied by the shift register unit is reduced.

Optionally, as shown in FIGS. 3A and 5, the active layer of the output transistor T10 and the active layer of the output reset transistor T9 may be formed of a continuous first semiconductor layer 10; the first semiconductor layer 10 extends along the first direction.

As shown in FIG. 5, the length of the first semiconductor layer 10 in the first direction is the output active length L1.

The minimum length of the first semiconductor layer 10 in the second direction is the output active length W1.

As shown in FIG. 3A, the output transistor T10 and the output reset transistor T9 are arranged in sequence along the first direction, but not limited to this; in actual operation, the output reset transistor T9 and the output transistor T10 can also be arranged in sequence along the first direction.

In at least one embodiment of the present disclosure, the output reset transistor T9 is used to provide an invalid light emitting control signal, and the output transistor T10 is used to provide a valid light emitting control signal.

In at least one embodiment of the present disclosure, the valid light emitting control signal may be a voltage signal capable of turning on the light emitting control transistor in the pixel circuit (the gate electrode of the light emitting control transistor is coupled to the light emitting control line), the invalid light emitting control signal may be a voltage signal capable of turning off the light emitting control transistor.

Specifically, the display area of the display substrate includes a plurality of sub-pixels; at least one of the plurality of sub-pixels includes a pixel driving circuit; the pixel driving circuit includes a transistor, a gate line, a light emitting control line, and a data line. The shift register unit included in the scan driving circuit may correspond to at least one light emitting control line, and the signal output line of each shift register unit is coupled to the corresponding at least one light emitting control line for providing the light emitting control signal for the corresponding light emitting control line.

In at least one embodiment of the present disclosure, the active layer of the output transistor and the active layer of the reset transistor may be formed by a continuous first semiconductor layer.

The active layer of the output transistor may include at least two first conductive portions arranged oppositely along the first direction, and at least one first channel portion; each first channel portion is arranged between two adjacent first conductive portions.

The active layer of the output reset transistor may include at least two second conductive portions arranged oppositely along the first direction, and at least one second channel portion; each second channel portion is arranged between two adjacent second conductive portions.

The first conductive portion of the active layer of the output transistor that is closest to the active layer of the output reset transistor can be multiplexed as the second conductive portion of the output reset transistor, so that the layout space of the output transistor and the output reset transistor can be further reduced, thereby achieving a narrow frame of the display substrate.

As shown in FIG. 5, the active layer of the output transistor T10 and the active layer of the output reset transistor T9 may be formed by a continuous first semiconductor layer 10.

The active layer of the output transistor T10 includes a first first conductive portion 111, a second first conductive portion 112, a third first conductive portion 113, a fourth first conductive portion 113, and a fifth first conductive portion 115, and sixth first conductive portion 116 arranged oppositely along the first direction; the active layer of the output transistor T10 further includes a first first channel portion 121, a second first channel portion 122, a third first channel portion 123, a fourth first channel portion 124, and a fifth first channel portion 125.

The first first channel portion 121 is arranged between the first first conductive portion 111 and the second first conductive portion 112, and the second first channel portion 122 is arranged between the second first conductive portion 112 and the third first conductive portion 113.

The third first channel portion 123 is arranged between the third first conductive portion 113 and the second fourth conductive portion 114, and the fourth first channel portion 124 is arranged between the fourth first conductive portion 114 and the fifth first conductive portion 115, the fifth first channel portion 125 is arranged between the fifth first conductive portion 115 and the sixth first conductive portion 116.

The sixth first conductive portion 116 is multiplexed as the first second conductive portion included in the active layer of the output reset transistor T9.

The active layer of the output reset transistor T9 also includes a second second conductive portion 132, a third second conductive portion 133, a fourth second conductive portion 134, and a fifth second conductive portion 132 and the sixth second conductive portion 136 arranged oppositely along the first direction; the active layer of the output reset transistor T9 also includes a first second channel portion 141, a second second channel portion 142, a third second channel portion 143, a fourth second channel portion 144 and the fifth second channel portion 145.

The first second channel portion 141 is arranged between the first second conductive portion and the second second conductive portion 132, and the second second channel portion 142 is arranged between the second second conductive portion 132 and the third second conductive portion 133, the third second channel portion 143 is arranged between the third second conductive portion 133 and the fourth second conductive portion 134, the fourth second channel portion 144 is arranged between the fourth second conductive portion 134 and the fifth second conductive portion 135, and the fifth second channel portion 145 is arranged between the fifth second conductive portion 135 and the sixth second conductive portion 136.

In the output transistor T10 and the output reset transistor T9, the conductive parts on both sides of the channel portion of each transistor may serve as the first electrode and the second electrode of the transistor, or may be connected to the first electrode and the second electrode of the transistor, so that T10 and T9 can be electrically connected to each other through the sixth first conductive portion 116.

When forming the first semiconductor layer 10, for example, the first semiconductor material layer may be formed first, and after forming the gate electrode G10 of the output transistor T10 and the gate electrode G9 of the output reset transistor T9, the gate electrode G10 of the output transistor T10 and the gate electrode G9 of the output reset transistor T9 are used as a mask to dope a part of the first semiconductor material layer that is not covered by the gate electrodes of the transistors, so that the part of the first semiconductor material layer that is not covered by the gate electrodes of the transistors is formed as the conductive portion, and a part of the first semiconductor material layer that is covered by the transistors is formed as the channel portion.

According to the specific structure of the above display substrate, in the display substrate according to at least one embodiment of the present disclosure, the output transistor T10 and the output reset transistor T9 in the shift register unit can be arranged along the first direction, the space occupied by the shift register unit in the second direction is reduced to make the display substrate more in line with the development needs of narrow frame.

Specifically, the gate electrode of the output transistor may include at least one output gate pattern, the first electrode of the output transistor includes at least one first electrode pattern, and the second electrode of the output transistor includes at least one second electrode pattern.

The output gate pattern is arranged between the adjacent first electrode pattern and the second electrode pattern.

The first electrode pattern, the output gate pattern, and the second electrode pattern all extend along the second direction.

Specifically, the gate electrode of the output reset transistor may include at least one output reset gate pattern, the first electrode of the output reset transistor includes at least one third electrode pattern, and the second electrode of the output reset transistor includes at least one fourth electrode pattern.

The output reset gate pattern is arranged between the adjacent third electrode pattern and the fourth electrode pattern.

The third electrode pattern, the output reset gate pattern and the fourth electrode pattern all extend along the second direction.

The fourth electrode pattern of the output reset transistor closest to the gate electrode of the output transistor is multiplexed as the second electrode pattern of the output transistor.

Figure 9:
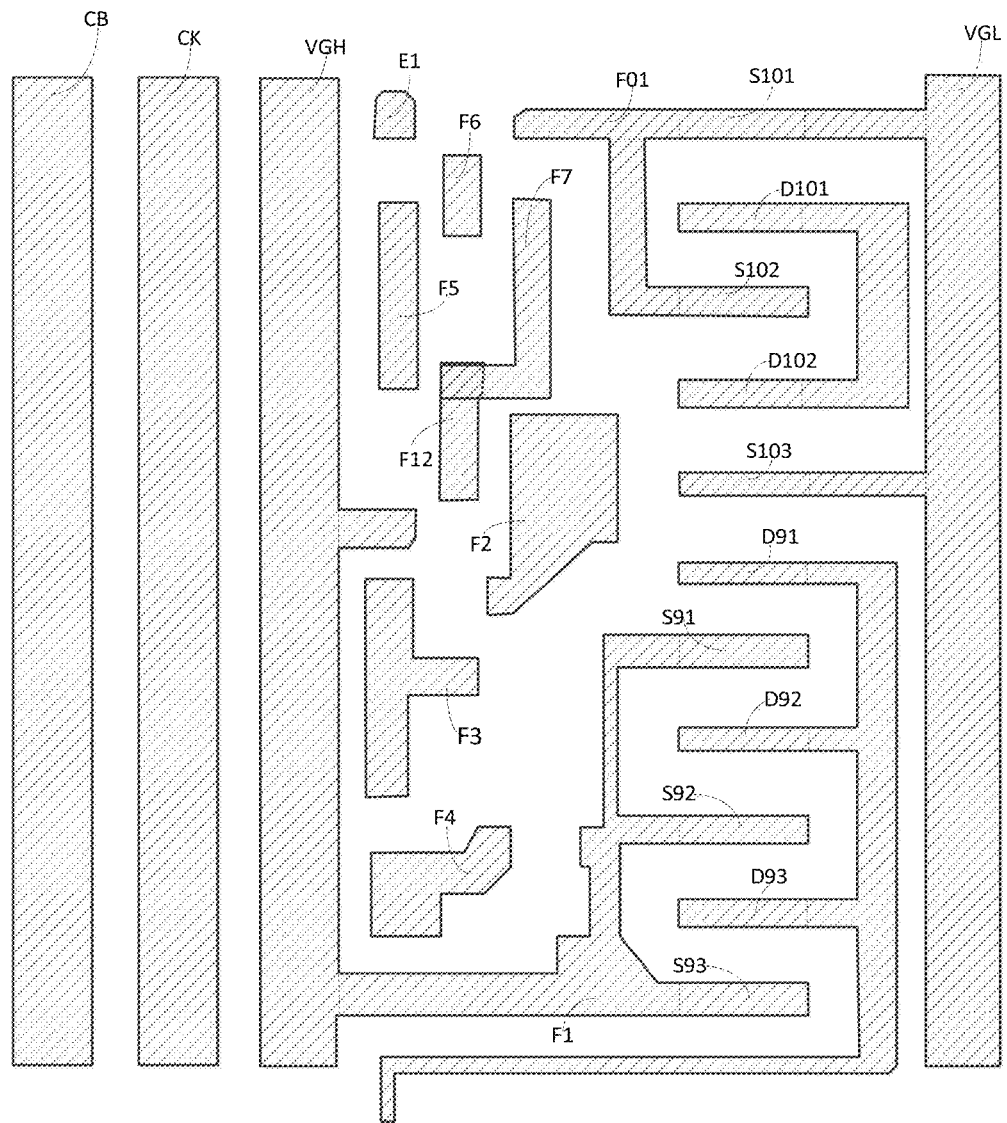
FIG. 9 is a schematic diagram of a source-drain metal layers in the shift register unit according to at least one embodiment of the present disclosure.

In specific implementation, the number of output reset gate patterns, the number of first electrode patterns, the number of second electrode patterns, the number of output gate patterns, and the number of the third electrode patterns and the number of the fourth electrode patterns can be set according to actual needs. Exemplarily, as shown in FIGS. 6 and 9, the number of output gate patterns and the number of output reset gate patterns may be five, the number of first electrode patterns may be three, and the number of second electrode patterns can be three, the number of third electrode patterns can be three, and the number of fourth electrode patterns can be three, but is not limited.

In addition, since the second electrode of the output transistor and the second electrode of the output reset transistor are both coupled to the signal output line, when the output transistor and the output reset transistor are laid out, the fourth electrode pattern of the output reset transistor closest to the gate electrode of the output transistor is multiplexed as the second electrode pattern of the output transistor, which can further reduce the layout space of the output transistor and the output reset transistor, which is beneficial to realize a narrow frame of the display substrate.

As shown in FIGS. 3A and 6, in some embodiments, the gate electrode of the output transistor T10 may include: a first output gate pattern G101, a second output gate pattern G102, a third output gate pattern G103, a fourth output gate pattern G104 and a fifth output gate pattern G105.

The gate electrode of the output reset transistor T9 may include: a first output reset gate pattern G91, a second output reset gate pattern G92, a third output reset gate pattern G93, a fourth output reset gate pattern G94, and a fifth output reset gate pattern G95.

The first output gate pattern G101, the second output gate pattern G102, the third output gate pattern G103, the fourth output gate pattern G104, and the fifth output gate pattern G105 are sequentially arranged along the first direction.

The first output reset gate pattern G91, the second output reset gate pattern G92, the third output reset gate pattern G93, the fourth output reset gate pattern G94, and the fifth output reset gate pattern G95 are sequentially arranged along the first direction.

The first output gate pattern G101, the second output gate pattern G102, the third output gate pattern G103, the fourth output gate pattern G104, and the fifth output gate pattern G105 all extend in the second direction, and the first direction intersects the second direction.

The first output gate pattern G101, the second output gate pattern G102, the third output gate pattern G103, the fourth output gate pattern G104, and the fifth output gate pattern G105 are coupled to each other.

The first output reset gate pattern G91, the second output reset gate pattern G92, the third output reset gate pattern G93, the fourth output reset gate pattern G94, and the fifth output reset gate pattern G95 all extend in the second direction.

The first output reset gate pattern G91, the second output reset gate pattern G92, the third output reset gate pattern G93, the fourth output reset gate pattern G94, and the fifth output reset gate pattern G95 are coupled to each other.

As shown in FIG. 9, the first electrode S10 of the output transistor T10 includes a first first electrode pattern S101, a second first electrode pattern S102, and a third first electrode pattern S103.

The second electrode D10 of the output transistor T10 includes a first second electrode pattern D101 and a second second electrode pattern D102.

The first electrode S9 of the output reset transistor T9 includes a first third electrode pattern S91, a second third electrode pattern S92, and a third third electrode pattern S93.

The second electrode D9 of the output reset transistor T9 includes a first fourth electrode pattern D91, a second fourth electrode pattern D92, and a third fourth electrode pattern D93.

The first fourth electrode pattern D91 is multiplexed as the third second electrode pattern included in the output transistor T10.

As shown in FIGS. 3A to 10, S101 is coupled to VGL, S101 is coupled to S102, S103 is coupled to VGL, S91, S92, and S93 are respectively coupled to the first conductive connection portion F1, and the first conductive connection portion F1 is coupled to the first voltage signal line VGH.

As shown in FIGS. 3A to 10, the first output line portion E01 is respectively coupled to D101 and D102 through a plurality of first signal line via holes H01 arranged in the signal line overlap area, and the first output line portion E01 is respectively coupled to D91, D92, and D93 through a plurality of second signal line via holes H02 arranged in the signal line overlap area.

The plurality of first signal line via holes H01 are sequentially arranged along the first direction, and the plurality of second signal line via holes H02 are sequentially arranged along the first direction.

In a specific implementation, the active layer of the output transistor may include at least two first conductive parts arranged oppositely along the first direction, and at least one first channel portion; each first channel portion is arranged between two adjacent first conductive portions.

The first channel portions correspond to the output gate patterns in a one-to-one manner, and the orthographic projection of each first channel portion on the base substrate is located within the orthographic projection of the corresponding output gate pattern on the base substrate.

A part of the first conductive portions in the output transistor correspond to the first electrode patterns in a one-to-one manner, and there is a first overlap area between the orthographic projection of the first electrode pattern on the base substrate and the orthographic projection of the first conductive portion on the base substrate, and the first electrode pattern is coupled to the corresponding first conductive portion through at least one first via hole provided in the first overlap area.

The other part of the first conductive portions of the output transistor correspond to the second electrode patterns in a one-to-one manner, and there is a second overlap area between the orthographic projection of the second electrode pattern on the base substrate and the orthographic projection of the first conductive portion on the base substrate, and the second electrode pattern is coupled to the corresponding first conductive portion through at least one second via hole provided in the second overlap area.

In specific implementation, the active layer of the output reset transistor includes at least two second conductive portions arranged oppositely along the first direction, and at least one second channel portion; each second channel portion is arranged between two adjacent second conductive portions.

The second channel portions correspond to the output reset gate patterns in a one-to-one manner, and the orthographic projection of each second channel portion on the base substrate is within the orthographic projection of the corresponding output reset gate pattern on the base substrate.

A part of the second conductive portions in the output reset transistor correspond to the third electrode patterns in a one-to-one manner, and there is a third overlap area between the orthographic projection of the third electrode pattern on the base substrate and the orthographic projection of the corresponding second conductive portion on the base substrate, and the third electrode pattern is coupled to the corresponding second conductive portion through at least one third via hole provided in the third overlap area.

The other part of the second conductive portions of the output reset transistor correspond to the fourth electrode patterns in a one-to-one manner, and there is a fourth overlap area between the orthographic projection of the fourth electrode pattern on the base substrate and the orthographic projection of the second conductive portion on the base substrate, and the fourth electrode pattern is coupled to the corresponding second conductive portion through at least one fourth via hole provided in the fourth overlap area.

As shown in FIGS. 5, 6, 8 and 9, the first first channel portion 121 corresponds to the first output gate pattern G101, and the second first channel portion 122 corresponds to the second output gate pattern G102, the third first channel portion 123 corresponds to the third output gate pattern G103, the fourth first channel portion 124 corresponds to the fourth output gate pattern G104, and the fifth first channel portion 125 corresponds to the fifth output gate pattern G105.

The orthographic projection of the first first channel portion 121 on the base substrate is located within the orthographic projection of the first output gate pattern G101 on the base substrate.

The orthographic projection of the second first channel portion 122 on the base substrate is located within the orthographic projection of the second output gate pattern G102 on the base substrate.

The orthographic projection of the third first channel portion 123 on the base substrate is located within the orthographic projection of the third output gate pattern G103 on the base substrate.

The orthographic projection of the fourth first channel portion 124 on the base substrate is located within the orthographic projection of the fourth output gate pattern G104 on the base substrate.

The orthographic projection of the fifth first channel portion 125 on the base substrate is located within the orthographic projection of the fifth output gate pattern G105 on the base substrate.

The first first conductive portion 111 corresponds to the first first electrode pattern S101, the second first conductive portion 112 corresponds to the first second electrode pattern D101, and the third first conductive portion 113 corresponds to the second first electrode pattern S102, the fourth first conductive portion 114 corresponding to the second second electrode pattern D102, the fifth first conductive portion 115 corresponds to the third first electrode pattern S103, and the sixth first conductive portion 116 corresponds to the first fourth electrode pattern D91.

The sixth first conductive portion 116 is multiplexed as the first second conductive portion included in the active layer of the output reset transistor T9.

The first second channel portion 141 corresponds to the first output reset gate pattern G91, the second second channel portion 142 corresponds to the second output reset gate pattern G92, and the third second channel portion 143 corresponds to the third output reset gate pattern G93, the fourth second channel portion 144 corresponds to the fourth output reset gate pattern G94, and the fifth second channel portion 145 corresponds to the fifth output reset gate pattern G95.

The orthographic projection of the first second channel portion 141 on the base substrate is located within the orthographic projection of the first output reset gate pattern G91 on the base substrate.

The orthographic projection of the second second channel portion 142 on the base substrate is located within the orthographic projection of the second output reset gate pattern G92 on the base substrate.

The orthographic projection of the third second channel portion 143 on the base substrate is located within the orthographic projection of the third output reset gate pattern G93 on the base substrate.

The orthographic projection of the fourth second channel portion 144 on the base substrate is located within the orthographic projection of the fourth output reset gate pattern G94 on the base substrate.

The orthographic projection of the fifth second channel portion 145 on the base substrate is located within the orthographic projection of the fifth output reset gate pattern G95 on the base substrate.

The second second conductive portion 132 corresponds to the first third electrode pattern S91, the third second conductive portion 133 corresponds to the second fourth electrode pattern D92, and the fourth second conductive portion 134 corresponds to the second third electrode pattern S92, the fifth second conductive portion 135 corresponds to the third fourth electrode pattern D93, and the sixth second conductive portion 136 corresponds to the third third electrode pattern S93.

There is a first first overlap area between the orthographic projection of S101 on the base substrate and the orthographic projection of the first first conductive portion 111 on the base substrate, and there is a second first overlap area between the orthographic projection of S102 on the base substrate and the orthographic projection of the third first conductive portion 113 on the base substrate, and there is a third first overlap area between the orthographic projection of S103 on the base substrate and the orthographic projection of the fifth first conductive portion 115 on the base substrate, S101 is coupled to the first first conductive portion 111 through the first via hole H1 arranged in the first first overlap area, S102 is coupled to the third The first conductive portion 113 through the first via hole H1 arranged in the second first overlap area, and S103 is coupled to the fifth first conductive portion 115 through the first via hole H1 provided in the third first overlap area.

There is a first second overlap area between the orthographic projection of D101 on the base substrate and the orthographic projection of the second first conductive portion 112 on the base substrate. There is a second second overlap area between the orthographic projection of D102 on the base substrate and the fourth first conductive portion 114, D101 is coupled to the second first conductive portion 112 through the second via hole H2 provided in the first second overlap area, and D102 is coupled to the fourth first conductive portion 114 through the second via hole H2 provided in the second second overlap area.

There is a first fourth overlap area between the orthographic projection of D91 on the base substrate and the orthographic projection of the first second conductive portion 131 on the base substrate, and there is a second and fourth overlap area between the orthographic projection of D92 on the bae substrate and the orthographic projection of the third second conductive portion 133 on the base substrate, and there is a third fourth overlap area between the orthographic projection of D93 on the base substrate and the fifth second conductive portion 135; D91 is coupled to the first second conductive portion 131 through the fourth via hole H4 provided in the first fourth overlap area, and D92 is coupled to the third second conductive portion 133 through the fourth via hole H4 provided in the second fourth overlap region, D93 is coupled to the fifth second conductive portion 133 through the fourth via hole H4 provided in the third fourth overlap area.

There is a first third overlap area between the orthographic projection of S91 on the base substrate and the orthographic projection of the second second conductive portion 132 on the base substrate, and there is a second third overlap area between the orthographic projection of S92 on the base substrate and the orthographic projection of the fourth second conductive portion 134 on the base substrate, and there is a third third overlap area between the orthographic projection of S93 on the base substrate and the orthographic projection of the sixth second conductive portion 136 on the base substrate; S91 is coupled to the second second conductive portion 132 through the third via hole H3 arranged in the first third overlap area, S92 is coupled to the fourth second conductive portion 134 through the third via hole H3 arranged in the second third overlap area, and S93 is coupled to the sixth second conductive portion 136 through the third via hole H3 provided in the third third overlap area.

In at least one embodiment of the present disclosure, the number of first via holes, the number of second via holes, the number of third via holes, and the number of fourth via holes can be set according to actual needs.

Figure 11:
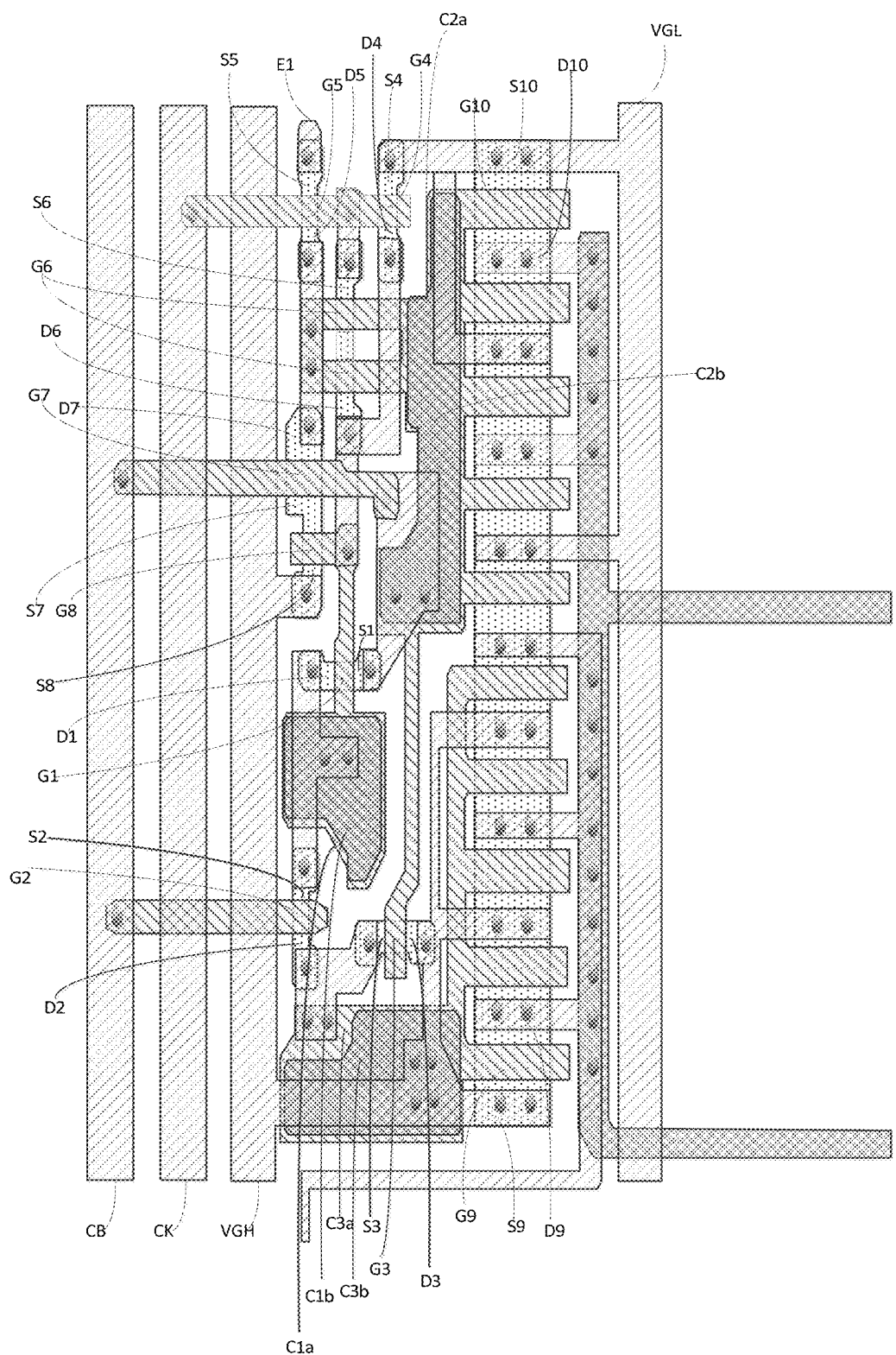
FIG. 11 is a schematic diagram of yet another layout of the shift register unit according to at least one embodiment of the present disclosure.

In the layout shown in FIG. 3A, the number of first via holes, the number of second via holes, and the number of third via holes are all three, but in actual operation, the number of the above via holes can be selected based on actual situation, for example, as shown in FIG. 11, in another layout, the number of first via holes, the number of second via holes, and the number of third via holes can all be two, as shown in the layout of FIG. 11, the length of the first semiconductor layer in the first direction is longer (compared to the layout shown in FIG. 3A), and the width of the first semiconductor layer in the second direction is smaller (compared with the layout shown in FIG. 3A), it is more conducive to reduce the width occupied by the shift register unit in the second direction, and is conducive to achieving a narrow frame.

In the display substrate provided by the above embodiment, the first semiconductor layer 10 is used to form the active layer of the output reset transistor T9 and the active layer of the output transistor T10, which not only makes the space occupied by T9 and T10 in the second direction smaller, but also increase the size of the active layer of the output reset transistor T9 and the active layer of the output transistor T10 in the first direction, thereby ensuring the channel width of T9 and the channel width of T10, and reducing the frame width of the display substrate while ensuring the working performance of T9 and T10.

Figure 7:
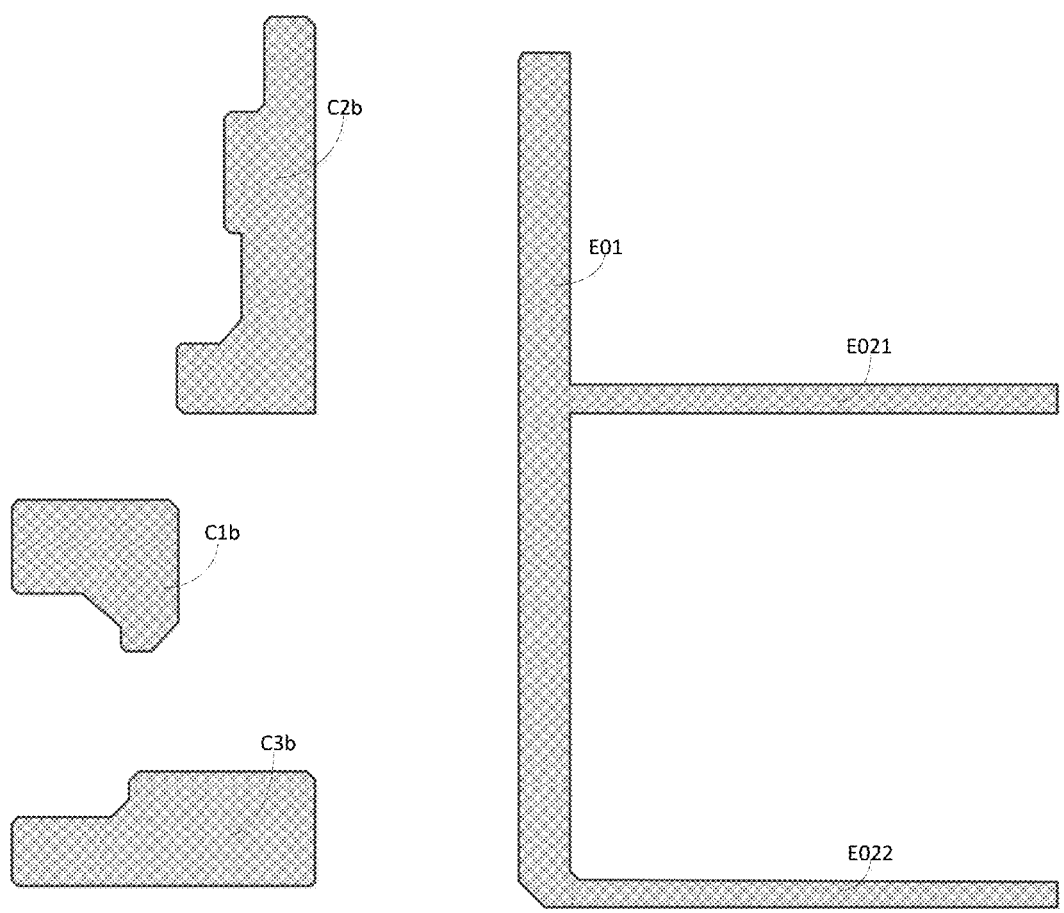
FIG. 7 is a schematic diagram of a second gate metal layer in the shift register unit according to at least one embodiment of the present disclosure.

In at least one embodiment of the present disclosure, FIG. 5 is a schematic diagram of the active layer in FIG. 3A, FIG. 6 is a schematic diagram of the first gate metal layer in FIG. 3A, FIG. 7 is a schematic diagram of the second gate metal layer in FIG. 3A, FIG. 8 is a schematic diagram of via holes made after the active layer, the first gate metal layer and the second gate metal layer are sequentially arranged, and FIG. 9 is a schematic diagram of the source-drain metal layer in FIG. 3A.

In specific implementation, an active layer, a first gate metal layer, a second gate metal layer, a via hole, and a source-drain metal layer are sequentially arranged on the base substrate to form a display substrate.

In at least one embodiment of the present disclosure, in addition to the output transistor and the output reset transistor, the at least one shift register unit may also include a plurality of transistors; the conductive parts on both sides of the channel portion of each transistor may be separately It corresponds to the first electrode and the second electrode of the transistor, or can be respectively coupled to the first electrode of the transistor and the second electrode of the transistor.

As shown in FIGS. 3A-9, S91, S92, and S93 are respectively coupled to the first conductive connection portion F1, and the first conductive connection portion F1 is coupled to the first voltage signal line VGH.

There is a fifth overlap area between the orthographic projection of the first conductive connection portion F1 on the base substrate and the orthographic projection of the second electrode plate C3b of the output reset capacitor C3 on the base substrate, and the first conductive connection portion F1 is coupled to the second electrode plate C3b of the output reset capacitor C3 through the fifth via hole H5 arranged in the fifth overlap area.

In specific implementation, the at least one shift register unit may further include a first transistor.

The first transistor includes a first active pattern, and the first active pattern extends in a second direction.

The first transistor is located on a side of the output circuit away from the display area.

As shown in FIGS. 1, 3A to 9, the at least one shift register unit may further include a first transistor T1.

The first transistor T1 includes a first active pattern A1, and the first active pattern A1 extends along a second direction.

The first transistor T1 is located on a side of the output circuit 01 away from the display area.

In at least one embodiment of the present disclosure, the first active pattern A1 of T1 extends along the second direction, so that T2 and T8 can be arranged more compactly and save lateral space.

As shown in FIGS. 3A to 9, the first transistor T1 includes a first active pattern A1, and the first active pattern A1 includes a first third conductive portion A11, a third channel portion A10 and a second third conductive portion A12 arranged sequentially along the second direction.

The first third conductive portion A11 is multiplexed as the first electrode S1 of the first transistor T1, and the second third conductive portion A12 is multiplexed as the second electrode D1 of the first transistor T1.

The first electrode S1 of the first transistor T1 is coupled to the second conductive connection portion F2 through the first connection via hole H11, and there is a sixth overlap area between the orthographic projection of the second conductive connection portion F2 on the base substrate and the orthographic projection of the second electrode plate C2b of the output capacitor C2 on the base substrate, and the second conductive connection portion F2 is coupled to the second electrode plate C2b of the output capacitor C2 through the sixth via hole H6 provided in the sixth overlap area.

The second electrode D1 of T1 is coupled to the third conductive connection portion F3 through the second connection via hole H21, and there is a seventh overlap area between the orthographic projection of the third conductive connection portion F3 on the base substrate and the orthographic projection of the second electrode plate C1b of C1 on the base substrate. F3 is coupled to the second electrode plate C1b of C1 through the seventh via hole H7 provided in the seventh overlap area.

The gate electrode G1 of T1 is coupled to the first electrode plate C1a of C1, and the gate electrode G1 of T1 is also coupled to the gate electrode G8 of T8.

As shown in FIG. 3A, the width of a part of the electrode plate of the output capacitor C2 between T4 and T10 in the second direction becomes narrower, and the width of a part of the electrode plate of C2 between T7 and T10 in the second direction also becomes narrower, so as to save space in the second direction for the layout of other devices. Furthermore, as shown in FIG. 3A, the length of the electrode plate of C2 in the first direction is also increased to ensure the area of the electrode plate of C2.

In at least one embodiment of the present disclosure, as shown in FIGS. 1 and 3A-9, the at least one shift register unit may further include a second transistor T2 and a third transistor T3.

The maximum distance in the second direction between the orthographic projection of the gate electrode G2 of the second transistor T2 on the base substrate and the orthographic projection of the gate electrode G3 of the third transistor T3 on the base substrate is a third predetermined distance.

The second transistor T2 and the third transistor T3 are located on the side of the output circuit away from the display area.

The second electrode D2 of the second transistor T2 is coupled to the second electrode D3 of the third transistor T3.

In at least one embodiment of the present disclosure, the third predetermined distance may be greater than or equal to 14 um and less than or equal to 50 um, but is not limited thereto.

In specific implementation, the second electrode D2 of the second transistor T2 is coupled to the second electrode D2 of the third transistor T3. Therefore, for the convenience of wiring, it is necessary to set T2 and T3 closer to each other, which is conducive to reduce the width in the second direction occupied by the shift register unit.

In at least one embodiment of the present disclosure, the maximum distance in the second direction between the orthographic projection of the gate electrode G2 of the second transistor T2 on the base substrate and the orthographic projection of the gate electrode G3 of the third transistor T3 on the base substrate is less than the third predetermined distance refers to the maximum distance in the second direction between the edge of the orthographic projection of G2 on the base substrate and the edge of the orthographic projection of G3 on the base substrate.

As shown in FIGS. 3A-9, the second transistor T2 includes a second active pattern.

The second active pattern A2 includes a first fourth conductive portion A21, a fourth channel portion A20, and a second fourth conductive portion A22 sequentially arranged along the first direction.

The first fourth conductive portion A21 is multiplexed as the first electrode S2 of the second transistor T2, and the second fourth conductive portion A22 is multiplexed as the second electrode D2 of the second transistor T2.

The first electrode S2 of the second transistor T2 is coupled to the third conductive connection portion F3 through the third connection via hole H31; there is a seventh overlap area between the orthographic projection of the third conductive connection portion F3 on the base substrate and the orthographic projection of the second electrode plate C1b of C1 on the base substrate, and F3 is coupled to the second electrode plate C1b of C1 through the seventh via hole H7 provided in the seventh overlap area, so that the first electrode S2 of the second transistor T2 is coupled to the second electrode plate C1b of C1.

The second electrode D2 of the second transistor T2 is coupled to the fourth conductive connection portion F4 through the fourth connection via hole H41.

The third transistor T3 includes a third active pattern A3.

The third active pattern A3 includes a first fifth conductive portion A31, a fifth channel portion A30, and a second fifth conductive portion A32 sequentially arranged along the second direction.

The first fifth conductive portion A31 is multiplexed as the first electrode S3 of the third transistor T3, and the second fifth conductive portion A32 is multiplexed as the second electrode D3 of the third transistor T3.

The first electrode S3 of the third transistor T3 is respectively coupled to S91, S92 and S93 through the fifth connection via hole H51.

The second electrode D3 of the third transistor T3 is coupled to the fourth conductive connection portion F4 through the sixth connection via hole H61.

Optionally, the at least one shift register unit may further include a first transistor, a second transistor and a first capacitor.

The second electrode of the first transistor and the first electrode of the second transistor are respectively coupled to the second electrode plate of the first capacitor, and the gate electrode of the first transistor is coupled to the first electrode plate of the first capacitor.

The first transistor, the first capacitor, and the second transistor are sequentially arranged along a first direction.

The first transistor, the first capacitor and the second transistor are located on a side of the output circuit away from the display area.

As shown in FIGS. 1, 3A to 9, the at least one shift register unit may further include a first transistor T1, a second transistor T2, and a first capacitor C1.

The second electrode D1 of the first transistor T1 and the first electrode D2 of the second transistor T2 are respectively coupled to the second electrode plate C1b of the first capacitor C1, and the gate electrode G1 of the first transistor T1 is coupled to the first electrode plate C1a of the first capacitor C1.

The first transistor T1, the first capacitor C1, and the second transistor T2 are arranged in sequence along a first direction.

The first transistor T1, the first capacitor C1 and the second transistor T2 are located on the side of the output circuit 01 away from the display area.

In at least one embodiment of the present disclosure, C1 is located between T1 and T2, and the arrangement position of T1, T2, and T3 matches the shape of the electrode plate of C1, so that the arrangement of T1, T2, T3, and C1 is more compact. In a specific implementation, as shown in FIG. 1, 3A-9, the scan driving circuit may also include a first voltage signal line VGH, and the at least one shift register unit may also include an output reset capacitor C3. The first electrode plate C3a of the output reset capacitor C3 is coupled to the gate electrode G9 of the output reset transistor T9, and the second electrode plate C3b of the output reset capacitor C3 is coupled to the first voltage signal line VGH.

The maximum width of the second electrode plate C3b of the output reset capacitor C3 in the second direction is a first predetermined width, and the maximum length of the second electrode plate C3b of the output reset capacitor C3 in the first direction is a second predetermined width length.

The output reset capacitor C3 is located on the side of the output circuit 01 away from the display area.

The orthographic projection of the second electrode plate C3b of the output reset capacitor C3 on the substrate is within the orthographic projection of the first electrode plate C3a of the output reset capacitor C3 on the substrate.

In at least one embodiment of the present disclosure, the first predetermined width can be greater than or equal to 3 um and less than or equal to 60 um, and the second predetermined length can be greater than or equal to 3 um and less than or equal to 20 um, but not limited to this.

Optionally, as shown in FIG. 3A, the first voltage signal line VGH extends along a first direction, and the first voltage signal line VGH is located on a side of the output reset capacitor C3 away from the display area.

In at least one embodiment of the present disclosure, the width of the second electrode plate C3b of C3 in the second direction is set to be small, so as to narrow the width of the shift register unit in the second direction; and to ensure the area of the electrode plate of C3, the length of the second electrode plate C3b of C3 in the first direction is set to be larger.

As shown in FIGS. 3A to 9, the first electrode plate C3a of C3 is coupled to the gate electrode G9 of T9.

There is an eighth overlap area between the orthographic projection of the first electrode plate C3a of C3 on the substrate and the orthographic projection of the fourth conductive connection portion F4 on the substrate, and C3a is coupled to the fourth conductive connection portion F4 through the eighth via hole H8 provided in the eighth overlap area, so that C3a is coupled to the second electrode D2 of the second transistor T2.

S91, S92, and S93 are respectively coupled to the first conductive connection portion F1, and the first conductive connection portion F1 is coupled to the first voltage signal line VGH.

There is a fifth overlap area between the orthographic projection of the first conductive connection portion F1 on the substrate and the orthographic projection of the second electrode plate C3b of the output reset capacitor C3 on the substrate, and the first conductive connection portion F1 is coupled to the second electrode plate C3b of the output reset capacitor C3 through the fifth via hole H5 provided in the fifth overlap area, so that C3b is coupled to S91, S92, and S93, respectively.

In at least one embodiment of the present disclosure, as shown in FIGS. 3A to 9, the output transistor T10 and the output reset transistor T9 are arranged along a first direction; the scan driving circuit further includes a second voltage signal line VGL; the at least one shift register unit also includes an output reset capacitor C3.

The second electrode plate C3b of the output reset capacitor C3 is coupled to the first voltage signal line VGH.

The first electrode S10 of the output transistor T10 is coupled to the second voltage signal line VGL, and the first electrode S9 of the output reset transistor T9 is coupled to the second electrode plate C3b of the output reset capacitor C3.

The output transistor T10 and the output reset transistor T9 are located on the side of the second voltage signal line VGL away from the display area.

Optionally, the scan driving circuit may further include a second voltage signal line; the at least one shift register unit may further include a fourth transistor.

The second voltage signal line is coupled to the electrode conductive connection portion, the electrode conductive connection portion extends along a second direction; the at least one first electrode pattern is arranged in sequence along the first direction.

The electrode conductive connection portion is coupled to the first first electrode pattern included in the first electrode of the output transistor.

The first electrode of the fourth transistor is coupled to the electrode conductive connection portion.

The minimum distance in the first direction between the orthographic projection of the gate electrode of the fourth transistor on the substrate and the orthographic projection of the electrode conductive connection portion on the substrate is a fourth predetermined distance.

In at least one embodiment of the present disclosure, the minimum distance in the first direction between the orthographic projection of the gate electrode of the fourth transistor on the substrate and the orthographic projection of the electrode conductive connection on the substrate refers to the minimum distance in the first direction between an edge of the orthographic projection of the gate electrode of the fourth transistor on the substrate and an edge of the orthographic projection of the electrode conductive connection on the substrate.

In at least one embodiment of the present disclosure, the fourth predetermined distance may be greater than or equal to 1 um and less than or equal to 5 um, but is not limited thereto.

In at least one embodiment of the present disclosure, while the output active length is increased, the fourth transistor is moved up to keep the distance between the gate electrode of the fourth transistor and the electrode conductive connection portion in the first direction relatively small, thereby utilizing the extra space in the first direction resulting from the increase in the output active length to lay out other components included in the shift register unit other than the output circuit, thereby narrowing the width of the shift register unit in the second direction.

As shown in FIGS. 3A to 9, the scan driving circuit may further include a second voltage signal line VGL; the at least one shift register unit may also include a fourth transistor T4.

The second voltage signal line VGL is coupled to the electrode conductive connection portion F01, which extends along the second direction; the first electrode S10 of the output transistor T10 includes the first first electrode pattern S101, the second first electrode pattern S102 and the third first electrode pattern S103 that are sequentially arranged along the first direction.

The electrode conductive connection portion FO1 is coupled to the first first electrode pattern S101.

The first electrode S4 of the fourth transistor T4 is coupled to the electrode conductive connection portion FO1 through an electrode connection via hole H0.

The minimum distance in the first direction between the orthographic projection of the gate electrode G4 of the fourth transistor T4 on the substrate and the orthographic projection of the electrode conductive connection portion FO1 on the substrate is a fourth predetermined distance, so that when S101 is moved up, T4 is also moved up.

As shown in FIG. 5, the fourth transistor T4 includes a fourth active pattern A4.

The fourth active pattern A4 includes a first sixth conductive portion A41, a sixth channel portion A40, and a second sixth conductive portion A42 that are sequentially arranged along the first direction.

The first sixth conductive portion A41 is multiplexed as the first electrode S4 of the fourth transistor T4, and the second sixth conductive portion A42 is multiplexed as the second electrode D4 of the fourth transistor T4.

In at least one embodiment of the present disclosure, the at least one shift register unit may further include a fourth transistor and a fifth transistor.

The gate electrode of the fourth transistor is coupled to the gate electrode of the fifth transistor.

The gate electrode of the fourth transistor and the gate electrode of the fifth transistor are included in a first gate metal pattern, and the first gate metal pattern extends in a second direction.

In a specific implementation, the fourth transistor and the fifth transistor may be arranged side by side, and when the fourth transistor is moved up, the fifth transistor is also moved up.

Optionally, the scan driving circuit may further include a first clock signal line, and the gate electrode of the fifth transistor is coupled to the first clock signal line.

The first clock signal line extends along a first direction, and the first clock signal line is located on a side of the five transistor away from the display area.

As shown in FIGS. 1 and 3A-9, the at least one shift register unit may further include a fourth transistor T4 and a fifth transistor T5; the scan driving circuit may also include a first clock signal line CK.

The gate electrode G4 of the fourth transistor T4 is coupled to the gate electrode G5 of the fifth transistor T5.

The gate electrode G4 of the fourth transistor T4 and the gate electrode G5 of the fifth transistor T5 are included in a first gate metal pattern 45, and the first gate metal pattern 45 extends along a second direction.

The gate electrode G5 of the fifth transistor T5 is coupled to the first clock signal line CK.

The first clock signal line CK extends along a first direction, and the first clock signal line CK is located on a side of the five transistor T5 away from the display area.

As shown in FIGS. 3A-9, there is a ninth overlap area between the orthographic projection of the first gate metal pattern 45 on the substrate and the orthographic projection of the first clock signal line CK on the substrate, and the first gate metal pattern 45 is coupled to the first clock signal line CK through a ninth via hole H9 provided in the ninth overlap area.

The first electrode S5 of T5 is coupled to the input signal end E1 through the seventh connection via hole H71.

As shown in FIG. 5, the fifth transistor T5 includes a fifth active pattern A5.

The fifth active pattern A5 includes a first seventh conductive portion A51, a seventh channel portion A50, and a second seventh conductive portion A52 that are sequentially arranged along the first direction.

The first seventh conductive portion A51 is multiplexed as the first electrode S5 of the fifth transistor T5, and the second seventh conductive portion A52 is multiplexed as the second electrode D5 of the fifth transistor T5.

In specific implementation, as shown in FIGS. 1, 3A-9, the at least one shift register unit may further include a first transistor T1, a fourth transistor T4, a fifth transistor T5, a sixth transistor T6, and an output capacitor C2.

The second electrode D5 of the fifth transistor T5 is coupled to the gate electrode G6 of the sixth transistor T6; the first electrode S1 of the fifth transistor T5 is coupled to the input signal end E1.

The gate electrode G6 of the sixth transistor T6 includes a first gate pattern g61 and a second gate pattern g62 coupled to each other.

The first gate pattern g61 and the second gate pattern g62 are respectively coupled to the first electrode plate C2a of the output capacitor C2, and the first electrode plate C2a of the output capacitor C2 is coupled to the gate electrode S10 of the output transistor T10.

The first electrode S6 of the sixth transistor T6 is coupled to the gate electrode G4 of the fourth transistor T4, the second electrode D6 of the sixth transistor T6 is coupled to the second electrode D4 of the fourth transistor T4, and the second electrode plate C2b of the output capacitor C2 is coupled to the first electrode S1 of the first transistor T1.

The fourth transistor T4, the sixth transistor T6, and the first transistor T1 are sequentially arranged along the first direction.

The fifth transistor T5, the sixth transistor T6, and the first transistor T1 are sequentially arranged along the first direction.

The output capacitor C2 is located between the sixth transistor T6 and the output circuit 01.

As shown in FIG. 5, the sixth transistor T6 includes a sixth active pattern A6.

The sixth active pattern A6 includes a first eighth conductive portion A61, a first eighth channel portion A601, a second eighth conductive portion A62, and a second eighth channel portion A602 and a third eighth conductive portion A63 that are arranged in sequence along the first direction.

The first eighth conductive portion A61 is multiplexed as the first electrode S6 of the sixth transistor T6, and the third eighth conductive portion A63 is multiplexed as the second electrode D6 of the sixth transistor T6.

As shown in FIGS. 3A-9, the gate electrode of T6 is included in the second gate metal pattern 60, and the second gate metal pattern 60 is U-shaped, so that the gate electrode of T6 includes first gate patterns g61 and the second gate pattern g62 coupled to each other.

The second gate metal pattern 60 is coupled to the fifth conductive connection portion F5 through the eighth connection via hole H81.

The second electrode D5 of T5 is coupled to the fifth conductive connection portion F5 through the ninth connection via hole H91, so that the second electrode D5 of T5 is coupled respectively to a first gate pattern g61 and a second gate pattern g62 coupled to each other included in the gate electrode of T6.

The first electrode S6 of T6 is coupled to the sixth conductive connection portion F6 through the tenth connection via hole H101, and the first gate metal pattern 45 is coupled to the sixth conductive connection portion F6 through the eleventh connection via hole H111.

The second electrode D6 of T6 is coupled to the seventh conductive connection portion F7 through the twelfth connection via hole H121, and the second electrode D4 of T4 is coupled to the seventh conductive connection portion F7 through the thirteenth connection via hole H131, so that the second electrode D6 of T6 is coupled to the second electrode D4 of T4.

In at least one embodiment of the present disclosure, as shown in FIGS. 1, 3A to 9, the at least one shift register unit may further include a second transistor T2, a first transistor T1, a sixth transistor T6, and a seventh transistor T7 and the eighth transistor T8.

As shown in FIG. 5, the active layer of the seventh transistor T7 and the active layer of the eighth transistor T8 may be formed by a continuous second semiconductor layer 20, and the second semiconductor layer 20 extends along the first direction.

The active layer of the seventh transistor T7 includes a first ninth conductive portion 211, a ninth channel portion 201, and a second ninth conductive portion 212 sequentially arranged along the first direction.

The second ninth conductive portion 212 is multiplexed as the first tenth conductive portion.

The active layer of the eighth transistor T8 includes a first tenth conductive portion, a tenth channel portion 202, and a second tenth conductive portion 222 sequentially arranged along the first direction.

The first ninth conductive portion 211 is used as the second electrode D7 of the seventh transistor T7, the second ninth conductive portion 212 is used as the first electrode S7 of the seventh transistor T7, and the second tenth conductive portion 222 is used as the first electrode S8 of the eighth transistor T8, and the first electrode S7 of the seventh transistor T7 is multiplexed as the second electrode D8 of the eighth transistor T8.

The gate electrode G7 of the seventh transistor T7 is coupled to the second electrode plate C2b of the output capacitor C2, and the second electrode D7 of the seventh transistor T7 is coupled to the gate electrode G6 of the sixth transistor T6.

The gate electrode G8 of the eighth transistor T8 is coupled to the gate G1 of the first transistor T1, and the first electrode S8 of the eighth transistor T8 is coupled to the first voltage signal line VGH.

The first voltage signal line VGH extends along a first direction.

The sixth transistor T6, the seventh transistor T7, the eighth transistor T8, and the second transistor T2 are sequentially arranged along the first direction.

In at least one embodiment of the present disclosure, along with the increase of the output active length, T5, T4, T6, T7, and T8 are all moved up, and the extra gap in the first direction is used to narrow the width of the shift register unit in the second direction.

Furthermore, the first electrode S7 of the seventh transistor T7 is multiplexed as the second electrode D8 of the eighth transistor T8, that is, in the display substrate according to at least one embodiment of the present disclosure, the seventh transistor T7 can be directly coupled to the eighth transistor T8 through the second ninth conductive portion 212 included in the second semiconductor layer 20, which reduces the area occupied by T7 and T8 in the first direction.

Optionally, as shown in FIGS. 1 and 3A-9, the scan driving circuit may further include a second clock signal line CB, the gate electrode G2 of the second transistor T2 and the gate electrode G7 of the seventh transistor T7 are respectively coupled to the second clock signal line CB.

The second clock signal line CB extends along the first direction, and the second clock signal line CB is located on a side of the second transistor T2 away from the display area.

As shown in FIGS. 3A-9, the second electrode D7 of T7 is coupled to the fifth conductive connection portion F5 through the fourteenth connection via hole H141, so that the second electrode D7 of T7 is coupled to the gate electrode G6 of T6.

The gate electrode G7 of T7 is respectively coupled to the eighth conductive connection portion F8 and the ninth conductive connection portion F9.

F8 is coupled to the second clock signal line CB through the fifteenth connection via hole H151.

F9 is coupled to the second conductive connection portion F2 through the sixteenth connection via hole H161, so that the gate electrode G7 of T7 is coupled to the second electrode plate C2b of C2.

The first electrode S8 of T8 is coupled to the first voltage signal line VGH through the seventeenth connection via hole H171.

The gate electrode G8 of T8 is respectively coupled to the gate electrode G1 of T1 and the first electrode plate C1a of C1.

As shown in FIGS. 3A-9, the gate electrode G2 of T2 is coupled to a tenth conductive connection portion F10, and the tenth conductive connection portion F10 is coupled to the second clock signal line CB through an eighteenth connection via hole 181.

As shown in FIG. 6, the gate electrode G3 of T3 can be coupled to the first electrode plate C2a of the output capacitor C2 through the eleventh conductive connection portion F11.

As shown in FIG. 9, G8 is coupled to the twelfth conductive connection portion F12 through the nineteenth connection via hole H191, and the twelfth conductive connection portion F12 is coupled to the second electrode D6 of T6 through the twelfth connection via hole H121.

Optionally, the scan driving circuit may further include a second voltage signal line and a signal output line.

The signal output line includes a first output line portion and at least one second output line portion.

Both the second voltage signal line and the first output line portion extend in a first direction, and the first output line portion is located between the second voltage signal line and the output circuit.

The second output line portion extends along the second direction.

The second output line portion is used to provide a light emitting control signal for the pixel circuit in the display area.

The first output line portion and the output circuit are located on a side of the second voltage signal line away from the display area.

In the layout shown in FIG. 3A, the signal output line includes two second output line portions. In specific implementation, the number of second output line portions included in the signal output line can be selected according to actual conditions.

In specific implementation, the scan driving circuit may further include a first voltage signal line, a second voltage signal line, a first clock signal line, and a second clock signal line.

The first voltage signal line, the second voltage signal line, the first clock signal line, and the second clock signal line all extend in a first direction.

The orthographic projection of the first voltage signal line on the substrate, the orthographic projection of the first clock signal line on the substrate, and the orthographic projection of the second clock signal line on the substrate are all located a side of the orthographic projection of the shift register unit on the substrate away from the display area.

The orthographic projection of the second voltage signal line on the substrate is located on a side of the shift register unit close to the display area.

In at least one embodiment of the present disclosure, the signal output line may further include at least one second output line portion, and the second output line portion is coupled to the first output line portion; the second output line portion extends to the display area and is used to provide a light emitting control signal for the pixel circuit located in the display area.

Specifically, the specific positions of the first clock signal line, the second clock signal line, and the first voltage signal line can be set according to actual needs. For example, the first clock signal line, the second clock signal line and the first voltage signal line are all arranged at the edge of the display substrate, that is, the orthographic projection of the first voltage signal line on the substrate, the orthographic projection of the first clock signal line on the substrate and the orthographic projection of the second clock signal line on the substrate are all located at a side of the orthographic projection of the shift register unit on the substrate away from the display area of the display substrate. When the shift register unit is laid out, it is possible to prevent the transistors in the shift register unit from excessive overlapping the first clock signal line, the second clock signal line, and the first voltage signal line, which is more conducive to improving the working performance of the shift register unit.

In addition, by arranging the first clock signal line, the second clock signal line, and the first voltage signal line to extend along the first direction, it is more advantageous for the display substrate to realize a narrow frame.

In at least one embodiment of the present disclosure, the phases of the first clock signal outputted by the first clock signal line and the second clock signal outputted by the second clock signal line may be opposite, but not limited to this.

In specific implementation, as shown in FIGS. 1 and 3A, the scan driving circuit may include a first voltage signal line VGH, a second voltage signal line VGL, a first clock signal line CK, a second clock signal line CB, and a signal output line; the at least one shift register unit may include a first capacitor C1, an output capacitor C2, an output reset capacitor C3, a first transistor T1, a second transistor T2, a third transistor T3, a fourth transistor T4, and a fifth transistor T5, a sixth transistor T6, a seventh transistor T7, an eighth transistor T8, an output reset transistor T9, and an output transistor T10.

The signal output line includes a first output line portion E01, a first second output line portion E021, and a second second output line portion E022.

The first output line portion E01, the first second output line portion E021 and the second second output line portion E022 are coupled to each other.

The first output line portion E01 extends in a first direction, and the first second output line portion E021 and the second second output line portion E022 are coupled to each other and extend in a second direction.

The output transistor T10 and the output reset transistor T9 are arranged along a first direction.

The gate electrode G10 of the output transistor T10 is coupled to the first electrode plate C2a of the output capacitor C2, the first electrode S10 of the output transistor T10 is coupled to the second voltage signal line VGL, and the second electrode D10 of the output transistor T10 is coupled to the first output line portion E01.

The gate electrode G9 of the output reset transistor T9 is coupled to the first electrode plate C3a of the output reset capacitor C3, the first electrode S9 of the output reset transistor T9 is coupled to the second electrode plate C3b of the output reset capacitor C3, the second electrode D9 of the output reset transistor T9 is coupled to the first output line portion E01.

The second electrode plate C3b of the output reset capacitor C3 is coupled to the first voltage signal line VGH; the second electrode plate C2b of the output capacitor C2 is coupled to the gate electrode G7 of the seventh transistor T7.

The first electrode S1 of the first transistor T1 is coupled to the second electrode plate C2b of the output capacitor C2, and the second electrode D1 of the first transistor T1 and the first electrode D2 of the second transistor T2 are respectively coupled to the second electrode plate C1b of the first capacitor C1, and the gate electrode G1 of the first transistor T1 is coupled to the first electrode plate C1a of the first capacitor C1.

The gate electrode G2 of the second transistor T2 and the gate electrode G7 of the seventh transistor T7 are respectively coupled to the second clock signal line CB, and the second electrode D2 of the second transistor T2 is coupled to the second electrode D3 of the third transistor T3.

The gate electrode G3 of the third transistor T3 is coupled to the gate electrode G10 of the output transistor T10, and the first electrode S3 of the third transistor T3 is coupled to the first electrode plate C3a of the output reset capacitor C3.

The gate electrode G4 of the fourth transistor T4 is coupled to the gate electrode G5 of the fifth transistor T5, the first electrode S4 of the fourth transistor T4 is coupled to the first electrode S10 of the output transistor T10, and the second electrode D4 of the fourth transistor T4 is coupled to the second electrode D6 of the sixth transistor T6.

The gate electrode G5 of the fifth transistor T5 is coupled to the first clock signal line CK, the second electrode D5 of the fifth transistor T5 is coupled to the gate electrode G6 of the sixth transistor T6; the first electrode S5 of the fifth transistor T5 is coupled to the input signal end E1.

The first electrode S6 of the sixth transistor T6 is coupled to the gate electrode G4 of the fourth transistor T4, and the second electrode D6 of the sixth transistor T6 is coupled to the second electrode D4 of the fourth transistor T4.

The gate electrode G7 of the seventh transistor T7 is coupled to the second electrode plate C2b of the output capacitor C2, the first electrode S7 of the seventh transistor T7 is multiplexed as the second electrode D8 of the eighth transistor G8, the second electrode D7 of the seventh transistor T7 is coupled to the gate electrode G6 of the sixth transistor G6.

The gate electrode G8 of the eighth transistor T8 is coupled to the gate electrode G1 of the first transistor T1, and the first electrode S8 of the eighth transistor T8 is coupled to the first voltage signal line VGH.

The first second output line portion E021 is coupled to the first output line portion E01; the first second output line portion E021 extends to the display area, and is used to provide a light emitting control signal for the display area of the pixel circuit.

The second second output line portion E022 is coupled to the first output line portion E01; the second second output line portion E022 extends to the display area, and is used to provide a light emitting control signal for the display area of the pixel circuit.

In specific implementation, the second voltage signal line may be arranged on a side of the shift register unit close to the display area.

The first voltage signal line, the first clock signal line and the second clock signal line are arranged on a side of the shift register unit away from the display area.

Along the direction close to the display area, the first clock signal line, the second clock signal line, and the first voltage signal line are arranged in sequence; or, in the direction close to the display area, the second clock signal line, the first clock signal line, and the first voltage signal line are arranged in sequence.

In at least one embodiment of the present disclosure, the scan driving circuit may further include a first start signal line and a second start signal line.

Along the direction close to the display area, the second start signal line, the first start signal line, the first clock signal line, the second clock signal line, and the first voltage signal line are arranged in sequence.

Along the direction close to the display area, the first start signal line, the second start signal line, the first clock signal line, the second clock signal line, and the first voltage signal line are arranged in sequence.

Along the direction close to the display area, the second start signal line, the first start signal line, the second clock signal line, the first clock signal line, and the first voltage signal line are arranged in sequence.

Along the direction close to the display area, the first start signal line, the second start signal line, the second clock signal line, the first clock signal line, and the first voltage signal line are arranged in sequence.

Figure 3B:
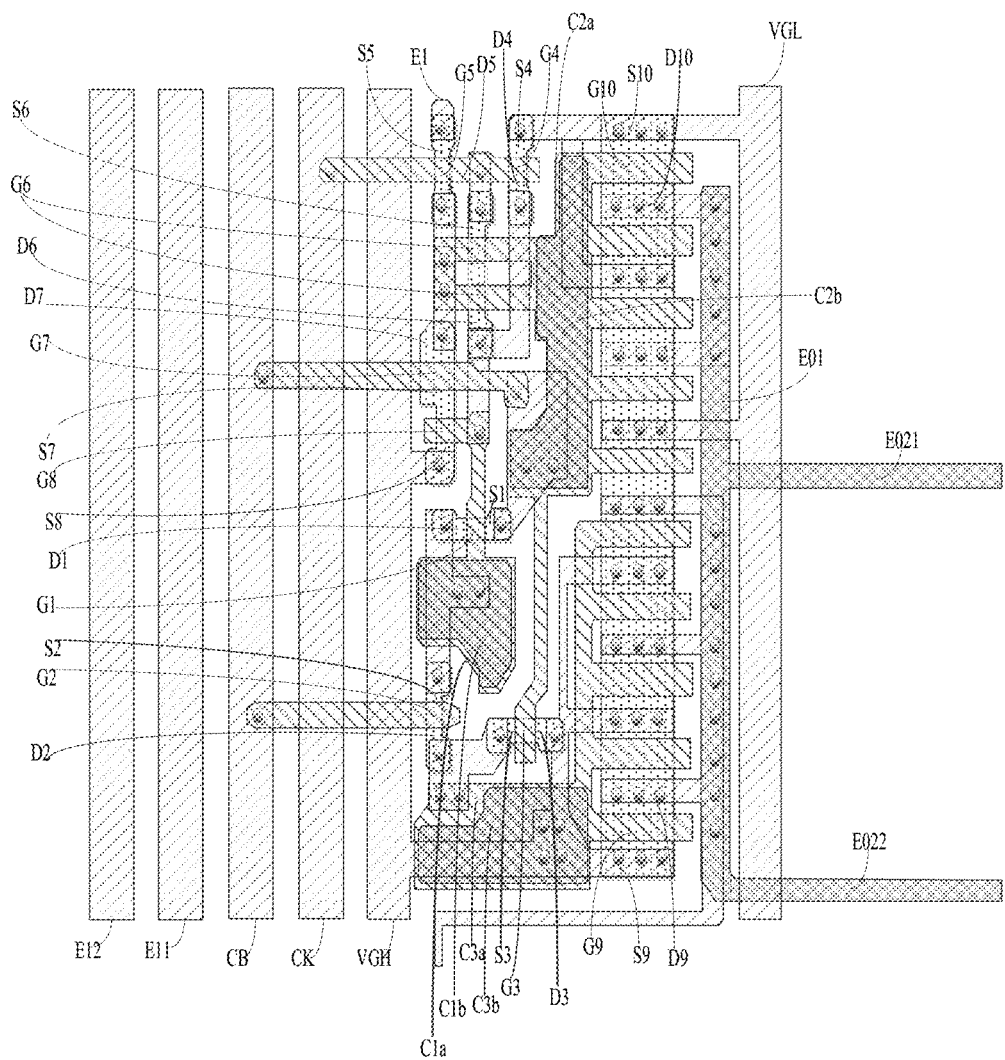
FIG. 3B is a schematic diagram of yet another layout of the shift register unit according to at least one embodiment of the present disclosure.

As shown in FIG. 3B, based on at least one embodiment of the shift register unit shown in FIG. 3A, at least one embodiment of the shift register unit may further include a first start signal line E11 and a second start signal line E12.

The first start signal line E11 and the second start signal line E12 may both extend in a first direction.

As shown in FIG. 3B, E12, E11, CB, CK, and VGH are arranged in sequence along the direction close to the display area.

In actual operation, the position of E11 and the position of E12 can be interchanged, that is, along the direction close to the display area, E11, E12, CB, CK, and VGH are arranged in sequence.

Optionally, as shown in FIG. 3A, the output transistor T10 and the output reset transistor T9 may be located between the output capacitor C2 and the first output line portion E01; along the first direction, the output transistor T10 and the output reset transistor T9 are arranged in sequence.

The first capacitor C1, the output capacitor C2, the output reset capacitor C3, the first transistor T1, the second transistor T2, the third transistor T3, the fourth transistor T4, the fifth transistor T5, the sixth transistor T6, the seventh transistor T7, and the eight transistor T8.

Along the first direction, the fifth transistor T5, the sixth transistor T6, the seventh transistor T7, the eighth transistor T8, the first transistor T1, the first capacitor C1, and the second transistor T2 and the output reset transistor T9 are arranged in sequence.

The fifth transistor T5, the fourth transistor T4, the sixth transistor T6, the seventh transistor T7, and the eighth transistor T8 are located between the output capacitor C2 and the first voltage signal line VGH.

The gate electrode G5 of the fifth transistor T5 and the gate electrode G4 of the fourth transistor T4 are included in a first gate metal pattern, and the first gate metal pattern extends along the second direction.

In at least one embodiment of the present disclosure, the display substrate may further include a plurality of rows of pixel circuits arranged on the substrate; the pixel circuit may include a light emitting control end.

The shift register unit corresponds to at least one row of the pixel circuits.

The signal output line of the shift register unit is coupled to the light emitting control end of the at least one row of pixel circuits, and is used to provide the light emitting control signal for the light emitting control end of the at least one row of pixel circuits.

In the layout shown in FIG. 3A, as shown in FIG. 5 (FIG. 5 is a schematic diagram of the active layer in FIG. 3A), the length of the first semiconductor layer 10 in the first direction is the output active length L1, so the minimum width of the first semiconductor layer 10 in the second direction is the output active width W1.

The output active length L1 is a first predetermined length.

The ratio of the output active length L1 to the output active width W1 is within a predetermined ratio range.

The output active width W1 is within a predetermined width range.

In the layout shown in FIG. 3A of the present disclosure, the output active length L1 is increased, so that the devices in the shift register unit other than the output circuit can use the extra vertical space due to the increase of L1 for layout, so as to further narrow the lateral space occupied by the shift register unit; and in at least one embodiment of the present disclosure, the output active width W1 can be reduced, so that devices in the shift register unit other than the output circuit can be layout with the saved horizontal space, the horizontal space occupied by the shift register unit can also be reduced.

In the layout shown in FIG. 3A of the present disclosure, T5, T4, T6, T7, and T8 are moved up, and the extra space in the vertical direction is used for layout, which can narrow the space occupied by the shift register unit in the horizontal direction.

In the layout shown in FIG. 3A of the present disclosure, the active pattern of T1 is changed to be arranged in the horizontal direction, so that the space between T2 and T3 can be more compact, and the arrangement positions of T1, T2, and T3 match the shape of the electrode plate of C1.

In the layout shown in FIG. 3A of the present disclosure, the shape of the first electrode plate of C3 and the shape of the second electrode plate of C3 are changed, and the width of the electrode plate of C3 in the second direction is narrowed to facilitate the compact arrangement of the shift register unit in the horizontal direction.

In the layout shown in FIG. 3A of the present disclosure, as shown in FIG. 3A and FIG. 8, the first output line portion E01 is coupled to the second electrode D10 of the output transistor T10 through a plurality of first signal line via holes H01 arranged in the signal line overlap area, the first output line portion E01 is coupled to the second electrode D9 of the output reset transistor T9 through a plurality of second signal line via holes H02 arranged in the signal line overlap area, the plurality of first signal line via holes H01 are arranged in sequence along the first direction, and the plurality of second signal line via holes H02 are arranged in sequence along the first direction.

As shown in FIGS. 4 and 10 (FIG. 10 is a schematic diagram of the source-drain metal layer in FIG. 3A, and the first source-drain metal pattern Ds1 and the second source-drain metal pattern Ds2 are shown in FIG. 10), the signal line overlap area includes a first signal line overlap area A01 and a second signal line overlap area A02. The first signal line overlap area A01 is an overlap area between the orthographic projection of the first output line portion E01 on the substrate and the orthographic projection of the first source-drain metal pattern Ds1 on the substrate, the first source-drain metal pattern Ds1 includes the second electrode D10 of the output transistor T10, the second signal line overlap area A02 is an overlap area between the orthographic projection of the first output line portion E01 on the substrate and the orthographic projection of the second source-drain metal pattern Ds2 on the substrate, the second source-drain metal pattern Ds2 includes the second electrode D9 of the output reset transistor T9.

As shown in FIG. 4, along the first direction, a ratio of the maximum distance K1 between the first first signal line via hole and the last first signal line via hole arranged in the first direction to the third length L3 is a third predetermined ratio; a minimum distance in the first direction between two adjacent first signal line via holes is the first predetermined distance; the third length L3 is a length of the first signal line overlap area A01 in the first direction.

Along the first direction, a ratio of the maximum distance K2 between the first second signal line via hole and the last second signal line via hole arranged in the first direction to the fourth length L4 is a fourth predetermined ratio; a minimum distance in the first direction between two adjacent second signal line via holes is the second predetermined distance; the fourth length L4 is a length of the second signal line overlap area A02 in the first direction.

In at least one embodiment of the present disclosure, the number of the first signal line via holes and the number of the second signal line via holes can be selected according to actual conditions.

As shown in FIGS. 3A, 4 and 10, since the active layer of T10 and the active layer of T9 are elongated longitudinally, the third length L3 and the fourth length L4 are correspondingly lengthened, so that a plurality of first signal line via holes H01 can be evenly arranged in the first signal line overlap area A01, and the ratio of the maximum distance K1 between the first first signal line via hole from top to bottom and the last first signal line via hole from top to bottom in the first direction to the third length L3 is the third predetermined ratio, and the plurality of first signal line via holes H01 can fill the first signal line overlap area A01 as much as possible, so that the second electrode D10 of the output transistor T10 is coupled to E01 in a better way.

As shown in FIGS. 3A, 4, and 10, since the active layer of T10 and the active layer of T9 are elongated longitudinally, the third length L3 and the fourth length L4 are correspondingly lengthened, so that a plurality of second signal line via holes H02 can be evenly arranged in the second signal line overlap area A02, and the ratio of the maximum distance K2 between the first second signal line via hole from top to bottom and the last second signal line via hole from top to bottom in the first direction to the fourth length L4 is the fourth predetermined ratio, and the plurality of second signal line via holes H02 can fill the second signal line overlap area A02 as much as possible, so that the second electrode D9 of the output reset transistor T9 can be coupled to E01 in a better way.

In at least one embodiment of the present disclosure, a first gate insulating layer may be provided between the semiconductor layer shown in FIG. 5 and the first gate metal layer shown in FIG. 6; a second gate insulating layer may also be provided between the first gate metal layer as shown in FIG. 6 and the second gate metal layer as shown in FIG. 7; an insulating layer may also be included between the second gate metal layer as shown in FIG. 7 and the source-drain metal layer as shown in FIG. 9.

When manufacturing the display substrate according to at least one embodiment of the present disclosure, a semiconductor material layer is first provided on the base substrate, and the semiconductor material layer is patterned to form the active layer of each transistor; as shown in FIG. 5, the first semiconductor layer 10, the second semiconductor layer 20, the first active pattern A1, the second active pattern A2, the third active pattern A3, the fourth active pattern A4, the fifth active pattern A5, and the sixth active graphics A6 are formed.

A first gate insulating layer is formed on a side of the active layer away from the substrate.

A first gate metal layer is formed at the side of the first gate insulating layer away from the active layer, and a patterning process is performed on the first gate metal layer. As shown in FIG. 6, gate electrodes of the transistors included in the shift register unit, the first electrode plate C3a of the output reset capacitor C3, the first electrode plate C1a of the first capacitor C1, and the first electrode plate C2a of the output capacitor C2 are formed.

Using the gate electrodes of the transistors as a mask, the portion of the active layer that is not covered by the gate electrodes is doped so that the portion of the active layer that is not covered by the gate electrodes is formed as a conductive portion, the portion of the active layer that is covered by the gate electrodes is formed as a channel portion; the conductive portion is used as a first electrode or a second electrode; or, the conductive portion is coupled to the first electrode or the second electrode.

A second gate metal layer is provided at the side of the second gate insulating layer away from the first gate metal layer, and a patterning process is performed on the second gate metal layer, as shown in FIG. 7, the signal output line, the signal input end E1, the second electrode plate C3b of the output reset capacitor C3, the second electrode plate C1b of the first capacitor C1, and the first electrode plate C2b of the output capacitor C2 are formed.

An insulating layer is arranged on the side of the second gate metal layer away from the second gate insulating layer.

As shown in FIG. 8, a plurality of via holes are provided on the substrate provided with the active layer, the first gate insulating layer, the first gate metal layer, the second gate insulating layer, the second gate metal layer and the insulating layer.

A source-drain metal layer is provided on the side of the insulating layer away from the second gate metal layer, and a patterning process is performed on the source-drain metal layer. As shown in FIG. 9, a first voltage signal line VGH, a second voltage signal line VGL, the first clock signal line CK, the second clock signal line CB, the second electrode of the output reset transistor T9, the first electrode of the output reset transistor T9, the second electrode of the output transistor T10, the first electrode of the output transistor T10 are formed.

The method of manufacturing the display substrate according to at least one embodiment of the present disclosure includes manufacturing a scan driving circuit on a substrate; the scan driving circuit includes a plurality of shift register units, and at least one of the plurality of shift register units includes an output circuit; the output circuit includes an output transistor and an output reset transistor.

The method of manufacturing the display substrate further includes: forming a semiconductor layer on the substrate, and performing a patterning process on the semiconductor layer to form an active layer of an output transistor and an active layer of an output reset transistor; forming a first gate metal layer on a side of the semiconductor layer away from the substrate, and performing a patterning process on the first gate metal layer to form a gate electrode of the output transistor and a gate electrode of the output reset transistor; using the gate electrode of the output transistor and the gate electrode of the output reset transistor as a mask, doping a portion of the semiconductor layer that is not covered by the gate electrodes so that the portion of the semiconductor layer that is not covered by the gate electrodes is formed as a conductive portion, and a part of the semiconductor layer that is covered by the gate electrodes is formed as a channel portion; forming a second gate metal layer on a side of the first gate metal layer away from the semiconductor layer, and performing a patterning process on the second gate metal layer to form a signal output line; the signal output line including a first output line portion extending in the direction; forming a first insulating layer on a side of the second gate metal layer away from the first gate metal layer; forming a plurality of first signal line via holes and a plurality of second signal line via holes in an area where the first insulating layer and the first output line partially overlap; the first signal line via holes and the second signal line via holes penetrating the first insulating layer; forming a source-drain metal layer on a side of the first insulating layer away from the second gate metal layer, and performing a patterning process on the source-drain metal layer to form a first source-drain metal pattern and a second source-drain metal pattern, the first source-drain metal pattern including the second electrode of the output transistor, and the second source-drain metal pattern including the second electrode of the output reset transistor, so that the first output line portion is coupled to the second electrode of the output transistor through the plurality of first signal line via holes, and the first output line portion is coupled to the second electrode of the output reset transistor through the plurality of second signal line via holes.

The signal output line includes a first output line portion extending in a first direction.

The plurality of first signal line via holes are arranged in sequence along the first direction, and the plurality of second signal line via holes are arranged in sequence along the first direction.

A ratio of the maximum distance in the first direction between any two first signal line via holes arranged in sequence along the first direction to the third length is the first predetermined ratio; the minimum distance between two adjacent first signal line via holes in the first direction is the first predetermined distance.

A ratio of the maximum distance in the first direction between any two second signal line via holes arranged in sequence along the first direction to the fourth length is the second predetermined ratio; the minimum distance between two adjacent second signal line via holes in the first direction is the second predetermined distance.

The third length is a length of the first signal line overlap area in the first direction, and the fourth length is a length of the second signal line overlap area in the first direction.

The first predetermined ratio is greater than or equal to 0.05 and less than or equal to 0.9.

The first predetermined distance is greater than or equal to 1.5 um and less than or equal to 45 um.

The second predetermined ratio is greater than or equal to 0.05 and less than or equal to 0.9.

The second predetermined distance is greater than or equal to 1.5 um and less than or equal to 65 um.

In at least one embodiment of the present disclosure, the output active length is increased, so that the devices in the shift register unit other than the output circuit can use the longitudinal space that is increased due to the increase in the output active length for layout, and thus the lateral space occupied by the shift register unit is narrowed; and in at least one embodiment of the present disclosure, the output active width is reduced, so that devices in the shift register unit other than the output circuit can use the saved lateral space for layout, the lateral space occupied by the shift register unit is reduced.

Optionally, the length of the active layer of the output transistor in the first direction is a first length, and the length of the active layer of the output reset transistor in the first direction is a second length, the sum of the first length and the second length is the output active length.

The smaller one of the minimum width of the active layer of the output transistor in the second direction and the minimum width of the active layer of the output reset transistor in the second direction is the output active width; the first direction intersects the second direction.

Optionally, the first predetermined length is greater than or equal to 50 um and less than or equal to 130 um.

Optionally, the ratio of the output active length to the output active width is within a predetermined ratio range; the predetermined ratio range may be greater than or equal to 3 and less than or equal to 11.

In at least one embodiment of the present disclosure, the output active width may be within a predetermined width range.

Optionally, the predetermined width range is greater than or equal to 12 um and less than or equal to 45 um.

The first output line portion is coupled to the second electrode of the output transistor through a plurality of first signal line via holes arranged in the signal line overlap area, and the first output line portion is coupled to the second electrode of the output reset transistor through the plurality of second signal line via holes in the signal line overlap area; the plurality of first signal line via holes are arranged in sequence along the first direction, and the plurality of second signal line via holes are arranged in sequence along the first direction.

The signal line overlap area includes a first signal line overlap area and a second signal line overlap area, and the first signal line overlap area is an overlap area between an orthographic projection of the first output line portion on the substrate and the orthographic projection of the first source-drain metal pattern on the substrate, the first source-drain metal pattern includes the second electrode of the output transistor, the second signal line overlap area is an overlap area between the orthographic projection of the first output line portion on the substrate and the orthographic projection of the second source-drain metal pattern on the substrate, the second source-drain metal pattern includes the second electrode of the output reset transistor.

The ratio of the maximum distance in the first direction between any two first signal line via holes arranged in sequence along the first direction to the third length is the first predetermined ratio; the minimum distance between two adjacent first signal line via holes in the first direction is a first predetermined distance; the third length is a length of the first signal line overlap area in the first direction.

The ratio of the maximum distance in the first direction between any two second signal line via holes arranged in sequence along the first direction to the fourth length is the second predetermined ratio; the minimum distance between two adjacent second signal line via holes in the first direction is a second predetermined distance; the fourth length is a length of the second signal line overlap area in the first direction.

Since the active pattern of the output transistor and the active pattern of the output reset transistor are elongated longitudinally, the third length and the fourth length are correspondingly longer, so that a plurality of first signal line via holes can be evenly arranged on the first signal line overlap area, and the ratio of the maximum distance between any two first signal line via holes in the first direction to the third length is the first predetermined ratio, and the plurality of first signal line via holes can fill the first signal line overlap area as much as possible, so that the second electrode of the output transistor is coupled to the first output line portion in a better way.

Since the active layer of the output transistor and the active layer of the output reset transistor are elongated longitudinally, the third length and the fourth length are correspondingly longer, so that a plurality of second signal line via holes can be evenly arranged in the second signal line overlap area, and the ratio of the maximum distance between any two second signal line via holes in the first direction to the fourth length is the second predetermined ratio, and the plurality of second signal line via holes can fill the second signal line overlap area as much as possible, so that the second electrode of the output reset transistor is coupled with the first output line portion in a better way.

Optionally, the method of manufacturing the display substrate according to at least one embodiment of the present disclosure may further include: forming a first transistor on a side of the output transistor away from the display area; the step of forming the first transistor includes: when forming the active layer of the output transistor and the active layer of the output reset transistor, forming a first active pattern of the first transistor, and the first active pattern extending in the second direction.

In at least one embodiment of the present disclosure, the first active pattern is arranged to extend along the second direction, the first transistor is arranged between the eighth transistor and the first capacitor, and the eighth transistor, the first transistor and the first capacitor are arranged in sequence along the first direction, so that the first transistor is set in the space between the eighth transistor and the first capacitor, so that the second transistor and the third transistor can be arranged more compactly (the second electrode of the second transistor is coupled to the second electrode of the third transistor, so for the convenience of wiring, the second transistor and the third transistor also need to be arranged closer), which can further narrow the width of the shift register unit in the second direction.

Optionally, the method of manufacturing the display substrate according to at least one embodiment of the present disclosure may further include: forming a second transistor and a third transistor on a side of the output reset transistor away from the display area.

The steps of forming the second transistor and the third transistor include: when forming the gate electrode of the output transistor and the gate electrode of the output reset transistor, forming the gate electrode of the second transistor and the gate electrode of the third transistor.

The maximum distance in the second direction between the orthographic projection of the gate electrode of the second transistor on the substrate and the orthographic projection of the gate electrode of the third transistor on the substrate is a third predetermined distance.

Optionally, the third predetermined distance is greater than or equal to 14 um and less than or equal to 50 um.

In specific implementation, the second electrode of the second transistor is coupled to the second electrode of the third transistor. Therefore, for the convenience of wiring, it is necessary to be able to arrange the second transistor and the third transistor closer, which is facilitate to reduce the width occupied by the shift register unit in the second direction.

In specific implementation, the method of manufacturing the display substrate described in at least one embodiment of the present disclosure may further include forming an output reset capacitor on the side of the output transistor away from the display area; the step of forming the output reset capacitor includes: when forming the gate electrode of the output transistor and the gate electrode of the output reset transistor, forming the first electrode plate of the output reset capacitor, and the first electrode plate of the output reset capacitor is coupled to the gate electrode of the output reset transistor; when forming the signal output line, forming the second electrode plate of the output reset transistor.

The maximum width of the second electrode plate of the output reset capacitor in the second direction is a first predetermined width, and the maximum length of the second electrode plate of the output reset capacitor in the first direction is a second predetermined length.

The orthographic projection of the second electrode plate of the output reset capacitor on the substrate is within the orthographic projection of the first electrode plate of the output reset capacitor on the substrate.

Optionally, the first predetermined width is greater than or equal to 3 um and less than or equal to 60 um, and the second predetermined length is greater than or equal to 3 um and less than or equal to 20 um. In at least one embodiment of the present disclosure, the width of the first electrode plate of the output reset capacitor in the second direction and the width of the second electrode plate of the output reset capacitor in the second direction are set to be smaller, the length of the first electrode plate of the output reset capacitor in the first direction and the length of the second electrode plate of the output reset capacitor in the first direction are set to be larger, so as to reduce the width occupied by the electrode plates of the output reset capacitor in the second direction while ensuring the area of the electrode plates of the output reset capacitor.

In at least one embodiment of the present disclosure, the signal output line may further include at least one second output line portion, and the second output line portion is coupled to the first output line portion; the second output line portion extends to the display area and is used to provide a light emitting control signal for the pixel circuit located in the display area.

The display device according to at least one embodiment of the present disclosure includes the above-mentioned display substrate.

Since the display substrate provided by the foregoing embodiment can achieve a narrow frame, the display device provided by the embodiment of the present disclosure can also achieve the beneficial effect of having a narrower frame when the display device provided by the embodiment of the present disclosure includes the foregoing display substrate, which will not be repeated here.

The display device provided by at least one embodiment of the present disclosure may be any product or component with a display function, such as a mobile phone, a tablet computer, a television, a monitor, a notebook computer, a digital photo frame, and a navigator.

Unless otherwise defined, any technical or scientific term used herein shall have the common meaning understood by a person skilled in the art. Such words as "first" and "second" used in the specification and claims are merely used to differentiate different components rather than to represent any order, number or importance. Such words as "include" or "contain" intends to indicate that an element or object before the word contains an element or object or equivalents thereof listed after the word, without excluding any other element or object. Such words as "connect" or "couple" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate comprising a scan driving circuit and a display area provided on a base substrate, wherein the scan driving circuit includes a plurality of shift register units, and at least one of the plurality of shift register units includes a signal output line and an output circuit, and the output circuit includes an output transistor and an output reset transistor;

the signal output line includes a first output line portion extending in a first direction;

the first output line portion is coupled to a second electrode of the output transistor through a plurality of first signal line via holes arranged in a signal line overlap area, and the first output line portion is coupled to a second electrode of the output reset transistor through a plurality of second signal line via holes arranged in the signal line overlap area; the plurality of first signal line via holes is arranged in sequence along the first direction, and the plurality of second signal line via holes is arranged in sequence along the first direction;

the signal line overlap area includes a first signal line overlap area and a second signal line overlap area, and the first signal line overlap area is an overlap area between an orthographic projection of the first output line portion on the base substrate and an orthographic projection of a first source-drain metal pattern on the base substrate, the second electrode of the output transistor is included in the first source-drain metal pattern, the second signal line overlap area is an overlap area between the orthographic projection of the first output line portion on the base substrate and the orthographic projection of a second source-drain metal pattern on the base substrate, the second electrode of the output reset transistor is included in the second source-drain metal pattern;

a ratio of a maximum distance in the first direction between any two first signal line via holes arranged in sequence along the first direction to a third length is a first predetermined ratio; a minimum distance in the first direction between two adjacent first signal line via holes is a first predetermined distance; the third length is a length of the first single line overlap area in the first direction;

a ratio of a maximum distance in the first direction between any two second signal line via holes arranged in sequence along the first direction to a fourth length is a second predetermined ratio; a minimum distance in the first direction between two adjacent second signal line via holes is a second predetermined distance; the fourth length is a length of the second signal line overlap area in the first direction;

the first predetermined ratio is greater than or equal to 0.05 and less than or equal to 0.9;

the first predetermined distance is greater than or equal to 1.5 um and less than or equal to 45 um;

the second predetermined ratio is greater than or equal to 0.05 and less than or equal to 0.9;

the second predetermined distance is greater than or equal to 1.5 um and less than or equal to 65 um.

2. The display substrate according to claim 1, wherein an active layer of the output transistor and an active layer of the output reset transistor are arranged along the first direction, and a length of the active layer of the output transistor in the first direction is a first length, a length of the active layer of the output reset transistor in the first direction is a second length, and a sum of the first length and the second length is an output active length;

a smaller one of a minimum width of the active layer of the output transistor in the second direction and a minimum width of the active layer of the output reset transistor in the second direction is an output active width; the first direction intersects the second direction.

3. The display substrate according to claim 2, wherein a ratio of the output active length to the output active width is within a predetermined ratio range; the predetermined ratio range is greater than or equal to 3 and less than or equal to 11, or wherein the output active width is within a predetermined width range; the predetermined width range is greater than or equal to 12 um and less than or equal to 45 um.

4. The display substrate according to claim 1, wherein an active layer of the output transistor and an active layer of the output reset transistor are formed by a continuous first semiconductor layer extending in the first direction;

a length of the first semiconductor layer in the first direction is an output active length;

a minimum length of the first semiconductor layer in the second direction is the output active length.

5. The display substrate according to claim 1, wherein the at least one shift register unit further includes a first transistor;

the first transistor includes a first active pattern, and the first active pattern extends in the second direction;

the first transistor is located on a side of the output circuit away from the display area.

6. The display substrate according to claim 1, wherein the at least one shift register unit further includes a second transistor and a third transistor, a second electrode of the second transistor is coupled to a second electrode of the third transistor;

a maximum distance in the second direction between an orthographic projection of a gate electrode of the second transistor on the base substrate and an orthographic projection of a gate electrode of the third transistor on the base substrate is a third predetermined distance;

the second transistor and the third transistor are located on a side of the output circuit away from the display area;

wherein the third predetermined distance is greater than or equal to 14 um and less than or equal to 50 um.

7. The display substrate according to claim 1, wherein the at least one shift register unit further includes a first transistor, a second transistor, and a first capacitor, a second electrode of the first transistor and a first electrode of the second transistor are respectively coupled to a second electrode plate of the first capacitor, and a gate electrode of the first transistor is coupled to a first electrode plate of the first capacitor;

the first transistor, the first capacitor, and the second transistor are arranged in sequence along the first direction;

the first transistor, the first capacitor and the second transistor are located on a side of the output circuit away from the display area.

8. The display substrate according to claim 1, wherein the scan driving circuit further includes a first voltage signal line, and the at least one shift register unit further includes an output reset capacitor, a first electrode plate of the output reset capacitor is coupled to a gate electrode of the output reset transistor, and a second electrode plate of the output reset capacitor is coupled to the first voltage signal line;

a maximum width of the second electrode plate of the output reset capacitor in the second direction is a first predetermined width, and a maximum length of the second electrode plate of the output reset capacitor in the first direction is a second predetermined length;

the output reset capacitor is located on a side of the output circuit away from the display area;

an orthographic projection of the second electrode plate of the output reset capacitor on the base substrate is within an orthographic projection of the first electrode plate of the output reset capacitor on the base substrate.

9. The display substrate according to claim 8, wherein the first predetermined width is greater than or equal to 3 um and less than or equal to 60 um, and the second predetermined length is greater than or equal to 3 um and less than or equal to 20 um; wherein the first voltage signal line extends along the first direction, and the first voltage signal line is located on a side of the output reset capacitor away from the display area.

10. The display substrate according to claim 1, wherein the output transistor and the output reset transistor are arranged along the first direction; the scan driving circuit further includes a second voltage signal line; the at least one shift register unit further includes an output reset capacitor;

a second electrode plate of the output reset capacitor is coupled to the first voltage signal line;

a first electrode of the output transistor is coupled to the second voltage signal line, and a first electrode of the output reset transistor is coupled to a second electrode plate of the output reset capacitor;

the output transistor and the output reset transistor are located on a side of the second voltage signal line away from the display area.

11. The display substrate according to claim 10, wherein a gate electrode of the output transistor includes at least one output gate pattern, the first electrode of the output transistor includes at least one first electrode pattern, and the second electrode of the output transistor includes at least one second electrode pattern;

the output gate pattern is located between first electrode pattern and the second electrode pattern adjacent to each other;

the first electrode pattern, the output gate pattern, and the second electrode pattern all extend along the second direction.

12. The display substrate according to claim 10, wherein a gate electrode of the output reset transistor includes at least one output reset gate pattern, a first electrode of the output reset transistor includes at least one third electrode pattern, and the second electrode of the output reset transistor includes at least one fourth electrode pattern;

the output reset gate pattern is located between the third electrode pattern and the fourth electrode pattern adjacent to each other;

the third electrode pattern, the output reset gate pattern and the fourth electrode pattern all extend along the second direction;

the fourth electrode pattern of the output reset transistor closest to a gate electrode of the output transistor is multiplexed as the second electrode pattern of the output transistor.

13. The display substrate according to claim 11, wherein an active layer of the output transistor includes at least two first conductive portions arranged oppositely along the first direction, and at least one first channel portion; each first channel portion is arranged between two adjacent first conductive portions;

the first channel portions correspond to the output gate patterns in a one-to-one manner, and an orthographic projection of each first channel portion on the base substrate is located within an orthographic projection of the corresponding output gate pattern on the base substrate;

a part of the first conductive portions of the output transistor correspond to the first electrode patterns in a one-to-one manner, and there is a first overlap area between an orthographic projection of the first electrode pattern on the base substrate and an orthographic projection of the first conductive portion on the base substrate, and the first electrode pattern is coupled to the corresponding first conductive portion through at least one first via hole provided in the first overlap area;

another part of the first conductive portions of the output transistor correspond to the second electrode patterns in a one-to-one manner, and there is a second overlap area between an orthographic projection of the second electrode pattern on the base substrate and the orthographic projection of the first conductive portion on the base substrate, and the second electrode pattern is coupled to the corresponding first conductive portion through at least one second via hole provided in the second overlap area.

14. The display substrate according to claim 12, wherein an active layer of the output reset transistor includes at least two second conductive portions arranged oppositely along the first direction, and at least one second channel portion; each second channel portion is arranged between two adjacent second conductive portions;

the second channel portions correspond to the output reset gate patterns in a one-to-one manner, and an orthographic projection of each second channel portion on the base substrate is within an orthographic projection of the corresponding output reset gate pattern on the base substrate;

a part of the second conductive portions of the output reset transistor correspond to the third electrode patterns in a one-to-one manner, and there is a third overlap area between an orthographic projection of the third electrode pattern on the base substrate and an orthographic projection of a corresponding second conductive portion on the base substrate, and the third electrode pattern is coupled to the corresponding second conductive portion through at least one third via hole provided in the third overlap area;

another part of the second conductive portions of the output reset transistor correspond to the fourth electrode patterns in a one-to-one manner, and there is a fourth overlap area between an orthographic projection of the fourth electrode pattern on the base substrate and an orthographic projection of a corresponding second conductive portion on the base substrate, and the fourth electrode pattern is coupled to the corresponding second conductive portion through at least one fourth via hole provided in the fourth overlap area.

15. The display substrate according to claim 11, wherein the scan driving circuit further includes a second voltage signal line; the at least one shift register unit further includes a fourth transistor;

the second voltage signal line is coupled to an electrode conductive connection portion, the electrode conductive connection portion extends along the second direction; the at least one first electrode pattern is arranged in sequence along the first direction;

the electrode conductive connection portion is coupled to a first first electrode pattern included in the first electrode of the output transistor;

a first electrode of the fourth transistor is coupled to the electrode conductive connection portion;

a minimum distance in the first direction between an orthographic projection of a gate electrode of the fourth transistor on the base substrate and an orthographic projection of the electrode conductive connection portion on the base substrate is a fourth predetermined distance;

wherein the fourth predetermined distance is greater than or equal to 1 um and less than or equal to 5 um.

16. The display substrate according to claim 1, wherein the at least one shift register unit further includes a fourth transistor and a fifth transistor;

a gate electrode of the fourth transistor is coupled to a gate electrode of the fifth transistor;

the gate electrode of the fourth transistor and the gate electrode of the fifth transistor are included in a first gate metal pattern, and the first gate metal pattern extends in the second direction;

wherein the scan driving circuit further includes a first clock signal line, and the gate electrode of the fifth transistor is coupled to the first clock signal line;

the first clock signal line extends along a first direction, and the first clock signal line is located on a side of the five transistor away from the display area.

17. The display substrate according to claim 1, wherein the at least one shift register unit further includes a first transistor, a fourth transistor, a fifth transistor, a sixth transistor, and an output capacitor;
- a first electrode of the fifth transistor is coupled to an input signal end, a second electrode of the fifth transistor is coupled to a gate electrode of the sixth transistor;
- a gate electrode of the sixth transistor includes a first gate pattern and a second gate pattern coupled to each other;
- the first gate pattern and the second gate pattern are respectively coupled to a first electrode plate of the output capacitor, and the first electrode plate of the output capacitor is coupled to a gate electrode of the output transistor;
- a first electrode of the sixth transistor is coupled to a gate electrode of the fourth transistor, a second electrode of the sixth transistor is coupled to a second electrode of the fourth transistor, and a second electrode plate of the output capacitor is coupled to a first electrode of the first transistor;
- the fourth transistor, the sixth transistor, and the first transistor are sequentially arranged along the first direction;
- the fifth transistor, the sixth transistor, and the first transistor are sequentially arranged along the first direction;

the output capacitor is located between the sixth transistor and the output circuit.

18. The display substrate according to claim 1, wherein the at least one shift register unit further includes a second transistor, a first transistor, a sixth transistor, a seventh transistor and the eighth transistor;
- an active layer of the seventh transistor and an active layer of the eighth transistor are formed by a continuous second semiconductor layer, and the second semiconductor layer extends along the first direction;
- the active layer of the seventh transistor includes a first ninth conductive portion, a ninth channel portion, and a second ninth conductive portion sequentially arranged along the first direction;
- the second ninth conductive portion is multiplexed as a first tenth conductive portion;
- the active layer of the eighth transistor includes the first tenth conductive portion, a tenth channel portion, and a second tenth conductive portion sequentially arranged along the first direction;
- the first ninth conductive portion is used as a second electrode of the seventh transistor, the second ninth conductive portion is used as a first electrode of the seventh transistor, and the second tenth conductive portion is used as a first electrode of the eighth transistor, and a first electrode of the seventh transistor is multiplexed as a second electrode of the eighth transistor;
- a gate electrode of the seventh transistor is coupled to second electrode plate of the output capacitor, and a second electrode of the seventh transistor is coupled to a gate electrode of the sixth transistor;
- a gate electrode of the eighth transistor is coupled to a gate electrode of the first transistor, and a first electrode of the eighth transistor is coupled to the first voltage signal line;
- the first voltage signal line extends along a first direction;
- the sixth transistor, the seventh transistor, the eighth transistor, and the second transistor are sequentially arranged along the first direction;
- wherein the scan driving circuit further includes a second clock signal line, a gate electrode of the second transistor and a gate electrode of the seventh transistor are respectively coupled to the second clock signal line;
- the second clock signal line extends along the first direction, and the second clock signal line is located on a side of the second transistor away from the display area.

19. The display substrate according to claim 1, wherein the scan driving circuit further includes a second voltage signal line and a signal output line;
- the signal output line includes a first output line portion and at least one second output line portion;
- both the second voltage signal line and the first output line portion extend in a first direction, and the first output line portion is located between the second voltage signal line and the output circuit;
- the second output line portion extends along the second direction;
- the second output line portion is used to provide a light emitting control signal for a pixel circuit in the display area;
- the first output line portion and the output circuit are located on a side of the second voltage signal line away from the display area.

20. The display substrate according to claim 1, wherein the scan driving circuit further includes a first voltage signal line, a second voltage signal line, a first clock signal line, and a second clock signal line;
- the first voltage signal line, the second voltage signal line, the first clock signal line, and the second clock signal line all extend in a first direction;
- an orthographic projection of the first voltage signal line on the base substrate, an orthographic projection of the first clock signal line on the base substrate, and an orthographic projection of the second clock signal line on the base substrate are all located a side of an orthographic projection of the shift register unit on the base substrate away from the display area;
- the orthographic projection of the second voltage signal line on the substrate is located on a side of the shift register unit close to the display area.

21. The display substrate according to claim 1, wherein the signal output line further includes at least one second output line portion, and the second output line portion is coupled to the first output line portion; the second output line portion extends to the display area and is used to provide a light emitting control signal for a pixel circuit in the display area.

22. The display substrate according to claim 1, wherein the scan driving circuit includes a first voltage signal line, a second voltage signal line, a first clock signal line, a second clock signal line, and a signal output line; the at least one shift register unit includes a first capacitor, an output capacitor, an output reset capacitor, a first transistor, a second transistor, a third transistor, a fourth transistor, a fifth transistor, a sixth transistor, a seventh transistor, and an eighth transistor, the signal output line includes at least one second output line portion;
- a gate electrode of the output transistor is coupled to a first electrode plate of the output capacitor, a first electrode of the output transistor is coupled to the second voltage signal line, and a second electrode of the output transistor is coupled to the signal output line;
- a gate electrode of the output reset transistor is coupled to a first electrode plate of the output reset capacitor, a first electrode of the output reset transistor is coupled to a second electrode plate of the output reset capacitor, a second electrode of the output reset transistor is coupled to the signal output line;

a second electrode plate of the output reset capacitor is coupled to the first voltage signal line; a second electrode plate of the output capacitor is coupled to a gate electrode of the seventh transistor;

a first electrode of the first transistor is coupled to the second electrode plate of the output capacitor, and a second electrode of the first transistor and a first electrode of the second transistor are respectively coupled to the second electrode plate of the first capacitor, and a gate electrode of the first transistor is coupled to the first electrode plate of the first capacitor;

a gate electrode of the second transistor and a gate electrode of the seventh transistor are respectively coupled to the second clock signal line, and a second electrode of the second transistor is coupled to a second electrode of the third transistor;

a gate electrode of the third transistor is coupled to a gate electrode of the output transistor, and a first electrode of the third transistor is coupled to the first electrode plate of the output reset capacitor;

a gate electrode of the fourth transistor is coupled to a gate electrode of the fifth transistor, a first electrode of the fourth transistor is coupled to the first electrode of the output transistor, and a second electrode of the fourth transistor is coupled to a second electrode of the sixth transistor;

a gate electrode of the fifth transistor is coupled to the first clock signal line, a second electrode of the fifth transistor is coupled to a gate electrode of the sixth transistor; a first electrode of the fifth transistor is coupled to the input signal end;

a first electrode of the sixth transistor is coupled to the gate electrode of the fourth transistor, and the second electrode of the sixth transistor is coupled to the second electrode of the fourth transistor;

a gate electrode of the seventh transistor is coupled to the second electrode plate of the output capacitor, a first electrode of the seventh transistor is multiplexed as a second electrode of the eighth transistor, a second electrode of the seventh transistor is coupled to the gate electrode of the sixth transistor;

a gate electrode of the eighth transistor is coupled to the gate electrode of the first transistor, and a first electrode of the eighth transistor is coupled to the first voltage signal line;

the second output line portion is coupled to the first output line portion; the second output line portion extends to the display area, and is used to provide a light emitting control signal for a pixel circuit in the display area.

23. The display substrate according to claim 22, wherein the second voltage signal line is arranged on a side of the shift register unit close to the display area;

the first voltage signal line, the first clock signal line and the second clock signal line are arranged on a side of the shift register unit away from the display area;

along the direction close to the display area, the first clock signal line, the second clock signal line, and the first voltage signal line are arranged in sequence; or, along the direction close to the display area, the second clock signal line, the first clock signal line, and the first voltage signal line are arranged in sequence.

24. The display substrate according to claim 23, wherein the scan driving circuit further includes a first start signal line and a second start signal line;

along the direction close to the display area, the second start signal line, the first start signal line, the first clock signal line, the second clock signal line, and the first voltage signal line are arranged in sequence; or along the direction close to the display area, the first start signal line, the second start signal line, the first clock signal line, the second clock signal line, and the first voltage signal line are arranged in sequence; or along the direction close to the display area, the second start signal line, the first start signal line, the second clock signal line, the first clock signal line, and the first voltage signal line are arranged in sequence; or along the direction close to the display area, the first start signal line, the second start signal line, the second clock signal line, the first clock signal line, and the first voltage signal line are arranged in sequence.

25. The display substrate according to claim 22, wherein the output transistor and the output reset transistor are located between the output capacitor and the first output line portion;

along the first direction, the output transistor and the output reset transistor are arranged in sequence;

the first capacitor, the output capacitor, the output reset capacitor, the first transistor, the second transistor, the third transistor, the fourth transistor, the fifth transistor, the sixth transistor, the seventh transistor, and the eight transistor;

along the first direction, the fifth transistor, the sixth transistor, the seventh transistor, the eighth transistor, the first transistor, the first capacitor, the second transistor and the output reset transistor are arranged in sequence;

the fifth transistor, the fourth transistor, the sixth transistor, the seventh transistor, and the eighth transistor are located between the output capacitor and the first voltage signal line;

the gate electrode of the fifth transistor and the gate electrode of the fourth transistor are included in a first gate metal pattern, and the first gate metal pattern extends along the second direction.

26. The display substrate according to claim 1, further comprising a plurality of rows of pixel circuits arranged on the base substrate; the pixel circuit includes a light emitting control end;

the shift register unit corresponds to at least one row of the pixel circuits;

the signal output line of the shift register unit is coupled to the light emitting control end of the at least one row of pixel circuits, and is used to provide a light emitting control signal for the light emitting control end of the at least one row of pixel circuits.

27. A display device comprising the display substrate according to claim 1.

* * * * *